(12) United States Patent
Piasecki

(10) Patent No.: US 10,601,259 B2
(45) Date of Patent: Mar. 24, 2020

(54) CURRENT SHUNT MONITOR

(71) Applicant: WiTricity Corporation, Watertown, MA (US)

(72) Inventor: Douglas S. Piasecki, Austin, TX (US)

(73) Assignee: WiTricity Corporation, Watertown, MA (US)

( * ) Notice: Subject to any disclaimer, the term of this patent is extended or adjusted under 35 U.S.C. 154(b) by 0 days.

(21) Appl. No.: 16/230,783

(22) Filed: Dec. 21, 2018

(65) Prior Publication Data
US 2019/0123594 A1    Apr. 25, 2019

Related U.S. Application Data

(63) Continuation of application No. 15/357,921, filed on Nov. 21, 2016, now Pat. No. 10,164,481.

(51) Int. Cl.
*H02J 50/60* (2016.01)
*H03F 3/45* (2006.01)
*G01R 19/165* (2006.01)
*G01R 15/14* (2006.01)
*H02J 50/12* (2016.01)
(Continued)

(52) U.S. Cl.
CPC ............ *H02J 50/60* (2016.02); *G01R 15/146* (2013.01); *G01R 17/16* (2013.01); *G01R 19/0092* (2013.01); *G01R 19/16538* (2013.01); *H02J 7/025* (2013.01); *H02J 50/12* (2016.02); *H03F 3/45071* (2013.01); *H03F 3/45475* (2013.01); *G01R 15/08* (2013.01); *H03F 2200/408* (2013.01); *H03F 2200/462* (2013.01);
(Continued)

(58) Field of Classification Search
CPC ............ G01R 31/3658; G01R 31/3606; G01R 31/3627; G01R 17/16; G01R 19/0092; G01R 31/3631; G01R 31/3648; G01R 31/3662; H02J 7/0019; H02J 7/0021; H02J 7/007; H02J 7/045; H02J 7/1492; H02J 7/0026; H02J 7/0031; H03F 2200/462; H03F 2203/45551
See application file for complete search history.

(56) References Cited

U.S. PATENT DOCUMENTS 6,967,516 B2 * 11/2005 Okayasu ............... H03K 5/133
327/276
7,015,728 B1 * 3/2006 Solic ...................... G01R 15/12
320/149

(Continued)

*Primary Examiner* — Vinh P Nguyen

(57) ABSTRACT

A current shunt monitor (CSM) circuit for monitoring the current through a sense resistor. An analog circuit provides an analog output signal proportional to the voltage across the sense resistor. A power supply includes a fixed voltage power supply at a first voltage supply level and a floating power supply. The floating power supply operates at a second voltage supply level referenced from the voltage level on a voltage input and a floating ground. The voltage input varies from a voltage level above the first voltage supply level to a voltage level below the first voltage supply level, and the floating power supply provides power to the analog circuit at least when the voltage level of the voltage input is above the first voltage supply level. A crossover circuit switches power from the floating power to the fixed voltage power supply at the first voltage supply level upon detecting the voltage level on the voltage input proximate in value to the first voltage supply level.

20 Claims, 12 Drawing Sheets

(51) Int. Cl.
   *G01R 17/16*   (2006.01)
   *G01R 19/00*   (2006.01)
   *H02J 7/02*    (2016.01)
   *G01R 15/08*   (2006.01)

(52) U.S. Cl.
   CPC .............. *H03F 2203/45138* (2013.01); *H03F 2203/45514* (2013.01); *H03F 2203/45551* (2013.01)

(56) References Cited

U.S. PATENT DOCUMENTS

| | | | | |
|---|---|---|---|---|
| 7,843,088 | B2* | 11/2010 | Perper | G06F 1/26 307/140 |
| 8,970,214 | B2* | 3/2015 | Tamura | B60L 3/0038 324/252 |
| 9,853,486 | B2* | 12/2017 | Liu | H02J 7/025 |
| 10,161,481 | B2* | 12/2018 | Sevagen | F16H 1/2863 |
| 10,164,481 | B2* | 12/2018 | Piasecki | G01R 19/0092 |
| 10,277,059 | B2* | 4/2019 | Der | H02J 7/025 |
| 2017/0093158 | A1* | 3/2017 | Perper | H02J 3/00 |

* cited by examiner

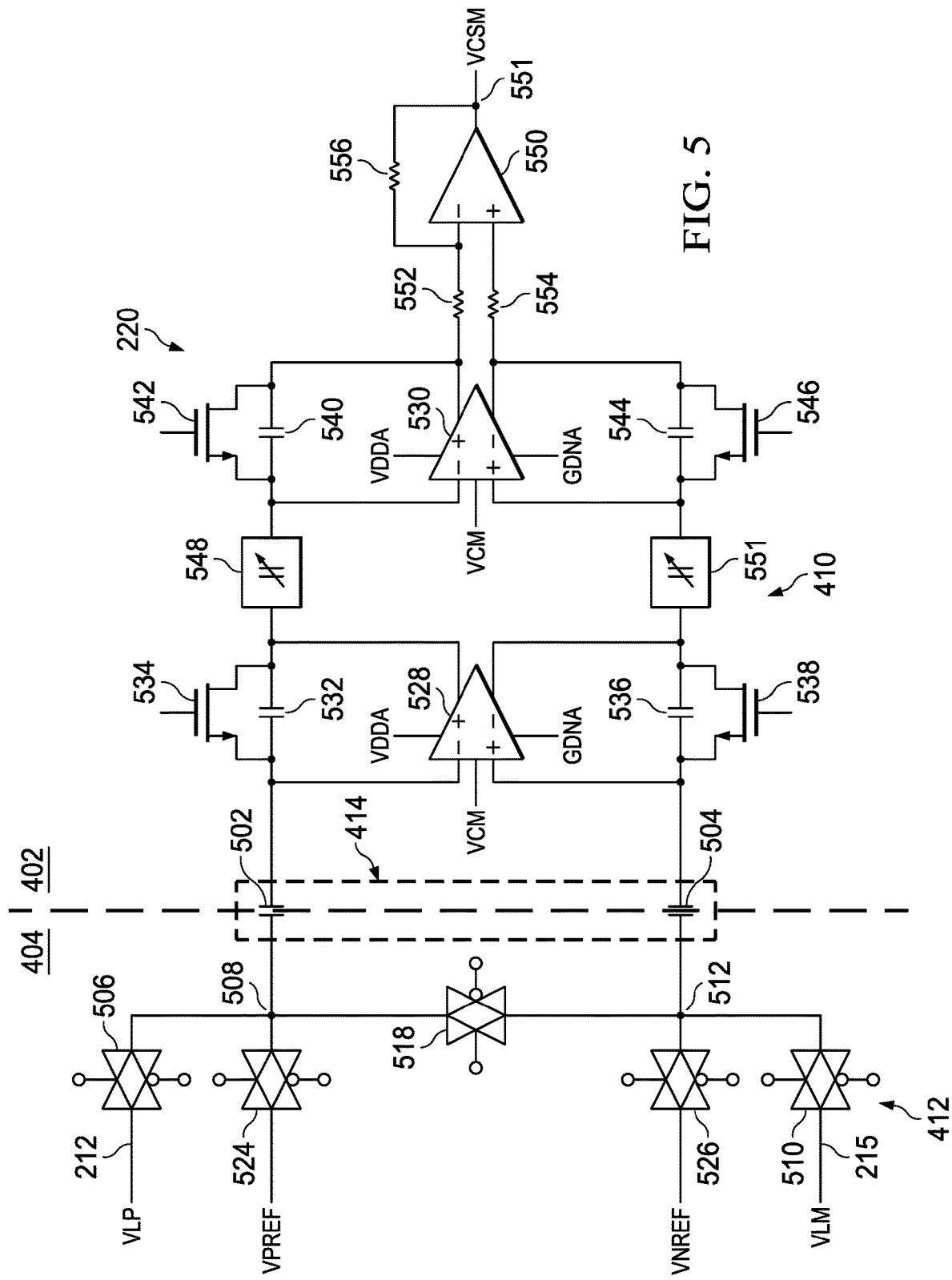

CURRENT SHUNT MONITOR

CROSS-REFERENCE TO RELATED APPLICATIONS

This application is a continuation of U.S. patent application Ser. No. 15/357,921, filed Nov. 21, 2016, entitled CURRENT SHUNT MONITOR, now U.S. Pat. No. 10,164,481, issued on Dec. 25, 2018, the specification of which is incorporated by reference herein in its entirety.

TECHNICAL FIELD

This application relates in general to Wireless Power Transfer (WPT) systems.

BACKGROUND

Wireless charging, also known as Wireless Power Transfer (WPT), is a technology that enables a power source to transmit electromagnetic energy to an electrical load across a gap, without interconnecting cords. Two directions for WPT are radiative wireless charging, which transfers energy via, for example, radiating electromagnetic, ultrasound, or acoustic waves and non-radiative charging, which transfers energy via an oscillating electromagnetic field.

Wireless power transmission systems can include a power transmitter unit (PTU) and power receiver unit (PRU). The transmitter can include components to supply power to a transmitter resonator coil which is coupled to a receiver resonator coil in a receiver. The receiver can be coupled to one or more loads, such as those of a mobile electronic device, medical device, vehicle, etc. It can be beneficial to have some type of communication path between the receiver and the transmitter in order to conserve efficiency.

SUMMARY

In one aspect thereof, the disclosure features a current shunt monitor (CSM) circuit for monitoring the current through a sense resistor disposed proximate the high side of a voltage input. This CSM circuit includes an analog circuit having first and second inputs connected across the sense resistor on opposite sides thereof and an output for providing an amplified analog output signal proportional to the voltage across the sense resistor. A power supply is provided that includes a fixed voltage power supply configured to provide a first voltage output operating at a first voltage supply level relative to a system ground reference and a floating power supply. The floating power supply is configured to operate at a second voltage supply level referenced from the voltage level on the voltage input and a floating ground, the floating power supply providing power to at least a portion of the analog circuit, the voltage level of the voltage input able to vary from a voltage level above the first voltage supply level to a voltage level below the first voltage supply level, and the floating power supply configured to provide power to the at least a portion of the analog circuit at least when the voltage level of the voltage input is above the first voltage supply level. The CSM circuit includes a crossover circuit configured to switch power from the floating power supply at the second voltage supply level to the fixed voltage power supply at the first voltage supply level upon detecting that the voltage level on the voltage input is proximate in value or less than the first voltage supply level.

In another implementation of the CSM, the voltage level on the voltage input is the voltage on a highest voltage side of the sense resistor.

In another implementation of the CSM, the fixed voltage power supply provides power to at least a second portion of the analog circuit for voltage values on a highest voltage side of the sense resistor.

In another implementation of the CSM, the analog circuit includes a differential amplifier having first and second inputs connected to opposite sides of the sense resistor and a differential analog output.

In a further implementation of the CSM, the differential amplifier comprises a switched capacitor amplifier controlled by digital switch control signals and wherein at least a first portion of the switched capacitor amplifier is powered by the floating power supply when the voltage level of the voltage input is above the first voltage supply level by the predetermined voltage value.

In a further implementation of the CSM, the fixed voltage power supply powers at least a second portion of the switched capacitor amplifier and wherein ones of the digital control signals control the first portion of the switched capacitor amplifier and others of the digital control signals control the second portion of the switched capacitor amplifier.

In a further implementation of the CSM, the digital control signals are received at voltage levels between system ground reference and the first voltage supply level and wherein the current voltage sense circuit includes a voltage translator for translating the ones of the digital control signals controlling the first portion of the switched capacitor amplifier to translated digital control signals to vary in voltage between the voltage level of the voltage input and the floating ground when the voltage level of the voltage input is above the first voltage supply level by the predetermined voltage value.

In a further implementation of the CSM, the switched capacitor amplifier includes first and second switching capacitors, each having one plate thereof connectable to a respective side of the sense resistor through a respective switch controlled by one of the translated digital control signals and each of the first and second capacitors having the other plates thereof connected to a respective one of first and second inputs of a differential input analog amplifier powered by the fixed power supply, wherein the second portion of the switched capacitor amplifier includes the differential input analog amplifier.

In another aspect thereof, the disclosure features a current shunt monitor (CSM) circuit for monitoring a current through a sense resistor disposed proximate a high side of a voltage input and operating across first and second voltage domains. The CSM circuit comprising a power supply including a fixed voltage supply and a floating power supply. The fixed voltage power supply operates at a fixed voltage output at a first voltage supply level relative to a system ground reference in the first voltage domain. The floating power supply operates at a floating voltage supply level in the second voltage domain and referenced from a voltage level on the voltage input and a floating ground. A voltage sense circuit is provided having first and second inputs connected across the sense resistor on opposite sides thereof and an output for providing an amplified analog output signal proportional to a voltage across the sense resistor. The voltage sense circuit includes an analog circuit with analog circuit components operating on a circuit supply voltage level that is less than a highest rated voltage on the voltage input. The floating power supply is configured to provide power to at least a first portion of the analog circuit, a crossover circuit is provided, which is configured to switch power to the at least a first portion of the analog circuit from the floating power supply at the second voltage supply level to the fixed voltage power supply at the first voltage supply level upon detecting that the voltage level on the voltage input is within a predetermined voltage value of the first voltage supply level.

In another aspect of the CSM circuit, the analog circuit includes a differential amplifier having first and second inputs connected to opposite sides of the sense resistor and a differential analog output.

In a further aspect of the CSM circuit, the differential amplifier comprises a switched capacitor amplifier controlled by digital switch control signals and wherein at least a first portion of the switched capacitor amplifier is powered by the floating power supply when the voltage level of the voltage input is above the first voltage supply level by the predetermined voltage value.

In a further aspect of the CSM circuit, the fixed voltage power supply powers at least a second portion of the switched capacitor amplifier and wherein the digital control signals control both the first and second portions of the switched capacitor amplifier.

In a further aspect of the CSM circuit, the digital control signals are received at voltage levels between system ground reference and the first voltage supply level and wherein the current voltage sense circuit includes a voltage translator for translating the ones of the digital control signals controlling the first portion of the switched capacitor amplifier to translated digital control signals to vary in voltage between the voltage level of the voltage input and the floating ground when the voltage level of the voltage input is above the first voltage supply level by the predetermined voltage value.

In a further aspect of the CSM circuit, the switched capacitor amplifier includes first and second switching capacitors, each having one plate thereof connectable to a respective side of the sense resistor through a respective switch controlled by one of the translated digital control signals and each of the first and second capacitors having the other plates thereof connected to a respective one of first and second inputs of a differential input analog amplifier powered by the a second power supply, wherein the second portion of the switched capacitor amplifier includes the differential input analog amplifier.

In another aspect thereof, the disclosure features a method for monitoring a current through a sense resistor disposed proximate a high side of a voltage input. The method includes the following steps. A voltage is sensed across the sense resistor on opposite sides thereof with a voltage sense circuit and there is provided an amplified analog output signal proportional to the voltage across the sense resistor. A fixed voltage output operating at a first voltage supply level relative to a system ground reference is provided. A second voltage supply level is generated referenced from a voltage level on the voltage input and a floating ground. At least a first portion of the voltage sense circuit is powered from the second voltage supply level, the second voltage supply level configurable to be maintained at the second voltage supply level as the voltage input varies from a voltage level above the first voltage supply level to a voltage level within a predetermined voltage value of the first voltage supply level. The second voltage supply level powers the at least a first portion of the voltage sense circuit at least when the voltage level of the voltage input is above the first voltage supply level by the predetermined voltage value. Power is switched to the at least a first portion of the voltage sense circuit from the second voltage supply level to the first voltage supply level upon detecting that the voltage level on the voltage input is within the predetermined voltage value of the first voltage supply level.

In another aspect of the method, a voltage level on the voltage input is the voltage on a highest voltage side of the sense resistor.

In another aspect of the method, the first voltage supply level powers at least a second portion of the voltage sense circuit for voltage values on a highest voltage side of the sense resistor.

In another aspect of the method, the voltage sense circuit includes a differential amplifier having first and second inputs connected to opposite sides of the sense resistor and a differential analog output.

BRIEF DESCRIPTION OF THE DRAWINGS

For a more complete understanding, reference is now made to the following description taken in conjunction with the accompanying Drawings in which:

FIG. 5 illustrates a circuit diagram of the CSM;

DETAILED DESCRIPTION

Figure 1:
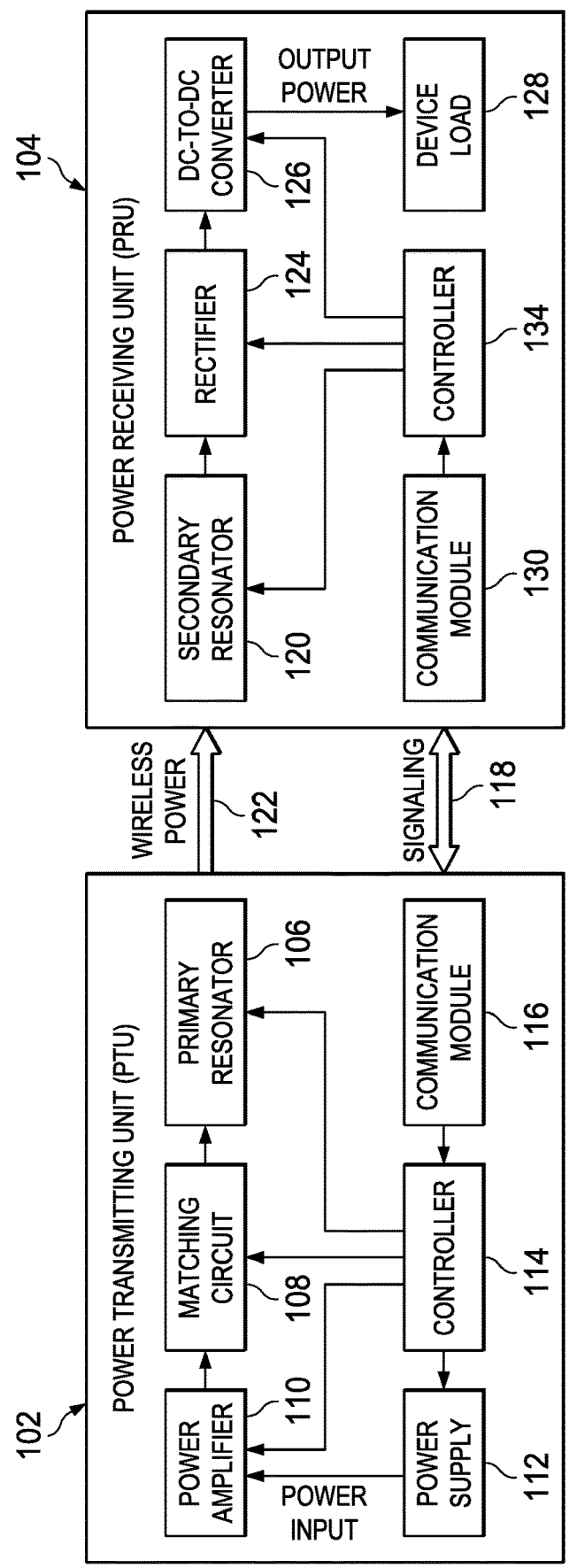
FIG. 1 illustrates a block diagram for a resonant Wireless Power Transfer (WPT) system including a transmitter and receiver.

Referring now to the drawings, wherein like reference numbers are used herein to designate like elements throughout, the various views and embodiments of a Current Shunt Monitor (CSM) are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1, there is illustrated a block diagram of an exemplary Wireless Power Transfer (WPT) system that includes a Power Transmitting Unit (PTU) 102 that interfaces with a Power Receiving Unit (PRU) 104. The wireless power is transferred from the PTU 102 to the PRU 104.

The PTU 102 includes a primary resonator 106 that generates an oscillating magnetic field to wirelessly transmit power to the PRU 104. A matching circuit 108 is provided for interfacing between a power amplifier 110 and the primary resonator 106. A power supply 112 is provided for generating power from an external source for input to the power amplifier 110. A controller 114 is provided for controlling the power supply 112, the power amplifier 110, and the matching circuit 108 and the primary resonator 106. The controller 114 interfaces with a communication module 116 in order to communicate with the PRU 104 over a bidirectional signaling path 118.

The PRU 104 includes a secondary resonator 120 interfacing with the primary resonator 106 of the PTU 102 via a wireless power path 122. The output of the secondary resonator 120 is input to a rectifier 124 for rectifying the output to a DC level, which is then input to a DC-to-DC converter 126. This comprises the output power which is then input to a device load 128. It should be understood that multiple loads could be interfaced with the DC-to-DC converter 126. A communication module 130 is operable to interface with the PTU 102 and the communication module 116 associated therewith via the signaling path 118. A controller 134 is provided on the PRU 104 for interfacing with the secondary resonator 120, the rectifier 124, the communication module 130 and the DC-to-DC converter 126.

The communication modules 116 and 130 provide for feedback signaling between the PRU 104 and the PTU 102 for the purpose of controlling the charging operation. The wireless power is generated at approximately 6.78 MHz of the Industrial Scientific Medical (ISM) frequency band. The communication on the signaling path 118 can be facilitated, for example, over an out-of-band communication path for control signaling and operates at the 2.4 GHz ISM band. For example, this out-of-band communication path can be via Bluetooth (BLE), Wifi, or radio.

The PTU 102 can operate in multiple functional states. One functional state is the Configuration state in which the PTU 102 does a self-check, one is the PTU Power Save state, in which the PTU 102 periodically detects changes in impedance at the primary resonator and one is the PTU Low Power state, in which the PTU 102 establishes a data connection with PRU(s). Another state is the PTU Power Transfer state, in which the PTU 102 can regulate power transfer. Another is the Local Fault State, which happens when the PTU 102 experiences any local fault conditions such as over-temperature. Another is the PTU Latching Fault state, which happens when rogue objects are detected, or when a system error or other failures are reported.

The PRU 104 also has a number of functional states. One is the Null State, when the PRU 104 is under-voltage, one is the PRU Boot state, when the PRU 104 establishes a communication link with the PTU 102, one is the PRU On state, when communication is performed, one is the PRU System Error State, when there is an over-voltage, over-current, or over-temperature alert, or when there is an error that has to shut down the power.

An exemplary communication protocol, used to support wireless charging functionality, can be via a Bluetooth Low Energy (BLE) link for the control of power levels, identification of valid loads, and protection of non-compliant devices. There can be three steps in the communication protocol, the first being device detection, the second being information exchange, and the third being charging control. With respect to device detection, the PTU 102 can beacon power until a PRU 104 broadcasts advertisements. The PTU 102 can reply to the PRU advertisements with a connection request. The information exchange allows the PTU 102 and PRU 104 to exchange their static and dynamic parameters. The charging control is initiated when the PTU 102 can provide sufficient power to meet the demand requested from the PRU 104, or when the PRU 104 is authorized to receive energy.

As will be described hereinbelow, the Current Shunt Monitor (CSM) can be utilized to monitor the current to the primary resonator 106 which can provide information, such as PRU 104 activity or foreign/rogue object presence. For example, if a foreign object is disposed in the vicinity of the wireless power transmission system, this might cause a shift in reflected impedance at the transmitter causing a change in current circulating in the wireless power transmitter (PTU 102). Surges in current can be detected by the controller 114 via monitoring of the power amplifier 110 via the CSM.

Figure 2:
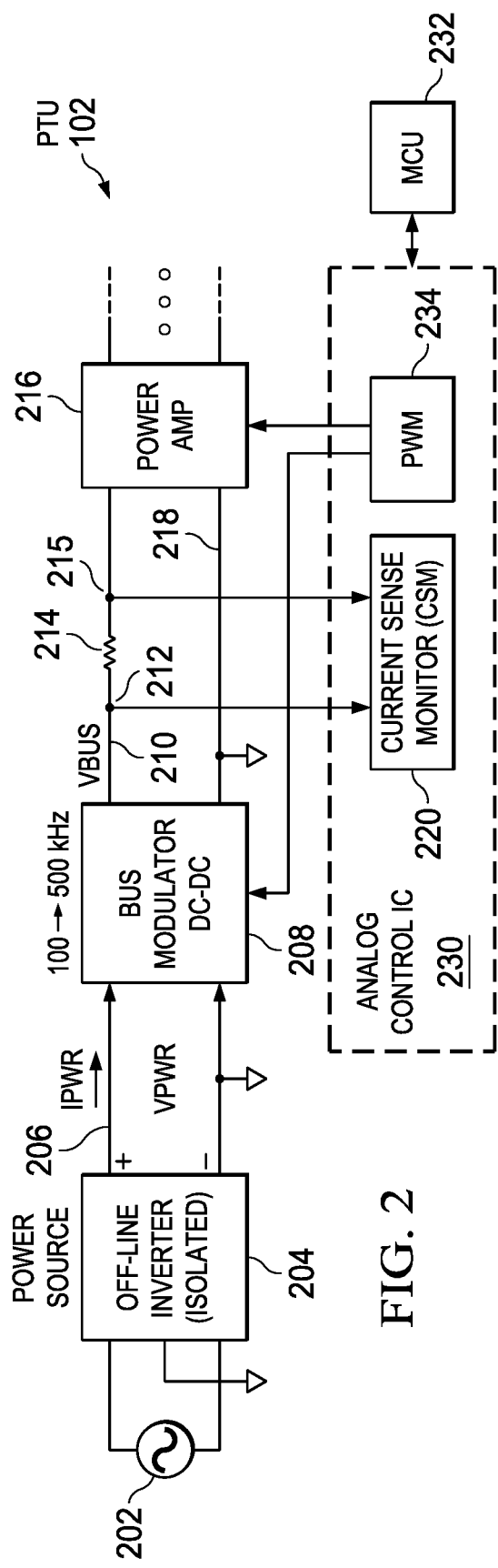
FIG. 2 illustrates a block diagram of a portion of the Current Shunt Monitor (CSM) incorporated within a WPT system.

Referring now to FIG. 2, there is illustrated a block diagram of the PTU 102 (a portion thereof) associated with the CSM. In this portion of the PTU 102, an AC power source 202 is provided that drives an off-line inverter 204 to provide a DC power voltage on a line 206. This drives a bus modulator 208 which is a DC-to-DC converter 208 that operates in the 100 kHz-500 kHz range. The output thereof on a voltage line 210 provides bus voltage VBUS on a node 212. A sense resistor 214 is disposed between the node 212 and a node 215 which is input to a power amplifier 216 that can be realized with an RF inverter or a DC/AC converter. A ground line 218 is disposed between the bus modulator 208 and the power amplifier 216 that can be realized with an RF inverter or DC/AC converter. The sense resistor 214 is referred to as the "current shunt resistor."

The voltage across the current shunt resistor 214 on the nodes 212 and 215 is input to a current shunt monitor (CSM) 220. The CSM 220 is operable to sense a very small voltage on the order of 20 mV across this resistor 214, wherein the voltage on the line to 210 can range from a very low voltage above ground up to 20-40 V or even higher. In certain modes, the CSM 220 can sense the current output by the bus modulator 208 to detect irregularities on the PRU 102 side. Further, it can also operate to sense current during "ramp up" of the PTU 102. For example, the PTU 102 can increase its power in a linear ramp up manner until there is sufficient power to deliver to the PRU 104. It is beneficial to monitor the current at the PTU 102 during this operation and, thus beneficial to configure the CSM 220 to operate from a very low voltage to a very high voltage on the order of 20-40 V or even higher.

The CSM 220 in the current embodiment can be an integral part of an analog control integrated circuit (IC) 230 which interfaces with a microcontroller unit (MCU) 232. The power amplifier 216 is also controlled by pulse width modulation (PWM) circuitry 234. Therefore, the basic components of the PTU 102 in the form of the power supply, the bus modulator, power amplifier, and resonator in addition to the matching circuitry (not shown) can be controlled by the analog control IC 230. This analog control IC 230 can monitor the operation of the basic components of the PTU 102 and obtain configuration information from the MCU 232.

Figure 3:
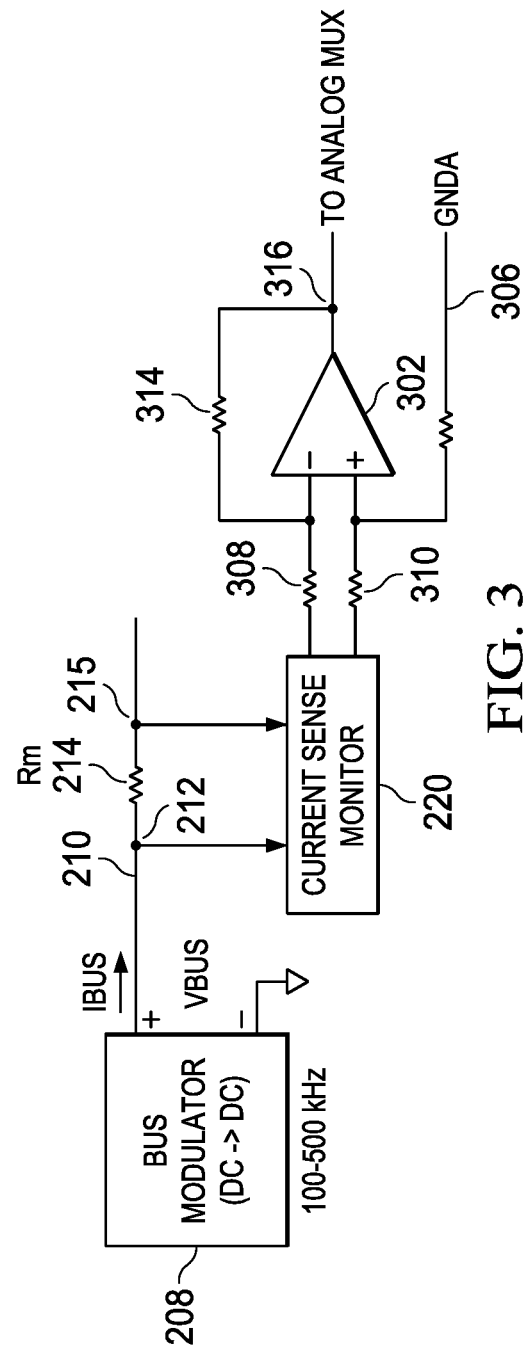
FIG. 3 illustrates a detailed block diagram of the CSM.

Referring now to FIG. 3, there is illustrated a more detailed diagram of CSM 220. The output of the CSM 220 is input to a single ended amplifier 302 receiving two differential inputs referenced to an analog ground GNDA on a node 306. The two differential outputs of the CSM 220 are input to the two differential inputs of the differential amplifier 302 through resistors 308 and 310, respectively, and a feedback resistor 314 is disposed from one input to an output. This output on a node 316 is then input to an analog multiplexer (not shown) that is disposed on the analog control IC 230 multiplexing multiple modules to an output.

Figure 4:
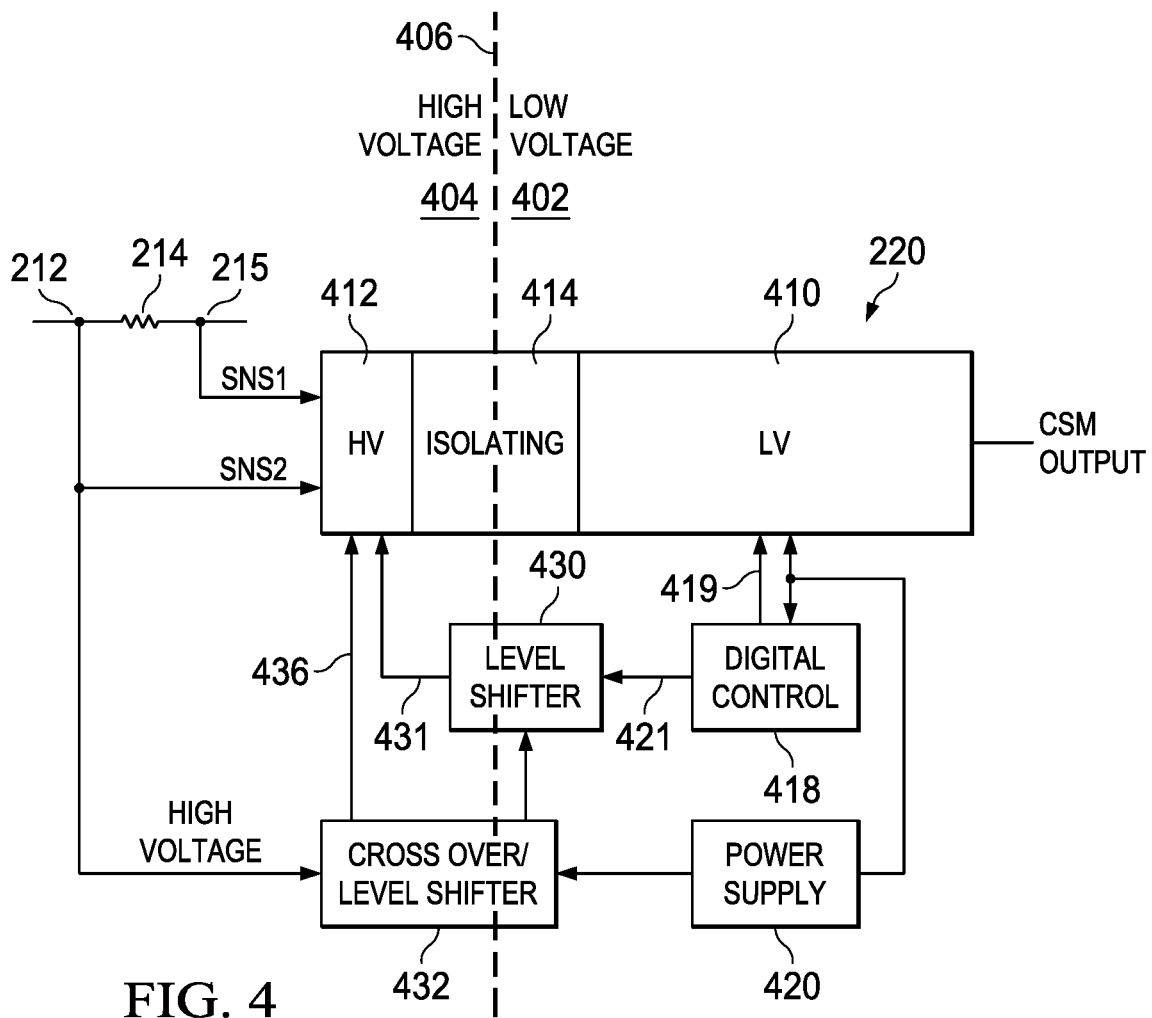
FIG. 4 illustrates a detailed block diagram of the CSM and the associated power supply.

Referring now to FIG. 4, there is illustrated a diagrammatic view of the overall power supply and digital control operation of the CSM 220. The overall system is defined as having a low-voltage analog side 402 and a high-voltage analog side 404, noting that the high-voltage side 404 is one where the voltage level can exist at a high voltage level within a high voltage domain. There is illustrated a dotted line 406 dividing the two sides. The low-voltage side 402 operates on a standard fixed analog voltage of approximately 5.0 V in a low voltage domain. In this embodiment, the analog circuitry in both the high-voltage side 404 and the low-voltage side 402 is operated at a low analog voltage level of 5.0 V, i.e., with the supply voltage level of 0.0 V-5.0 V. On the high-voltage side 404, the actual voltage level on nodes 212 and 215 can be as high as 20-40 V (or higher) and can also be as low as 0.0 V. However, analog and/or digital circuitry on the high-voltage side 404 operates at a voltage value of approximately 5.0 V. Therefore, even if the voltage level on VBUS on node 210 is higher than the low-voltage level of 5.0 V, this can be accommodated for. Without this drop in voltage, i.e., operating at a supply voltage level of 5.0 V, high-voltage rating would be required for some or all of the components for safe operation. Thus, the CSM 220 is divided into a low-voltage section 410 and a high-voltage section 412 and the analog circuitry associated with the CSM is divided between a portion in the low-voltage section 410 and a portion in the high-voltage section 412. There is provided an isolating section 414 between the two sections 410 and 412. A digital control section 418 is provided for controlling both the low-voltage section 410 and the high-voltage section 412. A power supply 420 is provided to output a voltage at a fixed voltage level of 5.0 V referenced to GNDA and power the digital control 418 on the low-voltage side 402 of the CSM 220 and the low-voltage section 410 of the CSM 220.

The digital control 418 generates digital control signals on a digital control line 419 for input to the low-voltage section 410, in which digital control voltage levels are limited to the upper supply voltage level of 5.0 V outputted by the power supply 420. Digital control 418 generates digital control signals on a digital control line 421 to control the high-voltage section 412. These digital control signals are output on a digital control line 421 and, when controlling the high-voltage section 412, are processed through a level shifter 430. This level shifter 430 shifts the upper and lower rail voltage levels up to the range required for control of the low-voltage analog components that exist within the high-voltage section 412, as will be described hereinbelow. For example, if the rail-to-rail digital voltage is between 0 V and 5 V, and the high-voltage level on the node 212 is 40 V, then the rail-to-rail voltage range for the digital control voltage output by the level shifter 431 on a "shifted" digital control line 431 will have a rail-to-rail digital voltage level of 5.0 V which results from the 40 V level on the node 212 being referenced to a floating reference or ground of 35 V.

Since there are two different sections operating at two different voltage levels, the high-voltage section 412 and the low-voltage section 410, it is noted that each of these two sections operate in different voltage domains. As will be described in detail hereinbelow, each section has switched analog circuitry operating therein which has associated therewith a rated voltage operating range, i.e., the voltage over which these analog circuits and the digital control voltages associated therewith can safely operate. As such, this analog circuitry must operate within its particular voltage domain, such that the ranges of the analog voltages that are input to and output from the analog circuitry and the associated digital switching voltages operate within that particular voltage domain. For example, when the voltage on the node 212 on one side of the current sensing resistor 214 is at a high-voltage of, for example, 40 V, then this voltage should exist within the high-voltage domain. The voltage on the other side of the current sensing resistor on node 215 may be a lower voltage (around 20 mV lower), but this voltage still should exist within the high-voltage domain. The digital control voltages on the digital control line 431 also should be confined within the high-voltage domain. With respect to analog voltages and digital switching voltages within the low-voltage domain associated with the low-voltage section 410, they should exist within the low-voltage domain.

For operating conditions where the voltage on the node 212 is above the voltage level of 5.0 V output by the power supply 420, there is provided a crossover/level shifter 432 which is operable to receive as a high voltage reference level the high-voltage level from the node 212 and also the 5.0 V level from the power supply 420. The output voltage range of the crossover/level shifter 432 on a line 436 is a voltage range that "floats" when the voltage on the node 212 is above the 5.0 V level of the power supply 420. The term "floats" refers to the operation wherein the voltage on node 212 provides a high voltage level as the upper rail voltage of the floating power supply voltage that powers the high voltage section 412 and a "floating" reference voltage relative to that upper rail voltage on node 212 that "floats" below the voltage on the node 212 by a voltage level of approximately 5.0 V. Typically, most low-voltage analog and digital circuitry can operate over a voltage range between 3.2 V and 5.0 V. Thus, when the voltage on node 212 is higher than the 5.0 V fixed voltage level output by the power supply 420, the actual voltage between the voltage on node 212 and the floating ground reference voltage (not shown), i.e., the "floating power supply voltage," is maintained to be approximately equal to the fixed voltage level of the power supply 420. This floating power supply provides an operating voltage that can be within the range of the rated operating voltages for the low-voltage analog components associated with the operation of the circuitry associated with high-voltage section 412 of the CSM 220. This circuitry is comprised of analog switches, as will be described herein below, as well as some digital circuitry. When the voltage on node 212 falls to a level close to or below the 5.0 V level of the fixed power supply output of the power supply 420, there can be a switchover at the level shifter 432 from the floating power supply output to the output of the power supply 420.

Figure 4A:
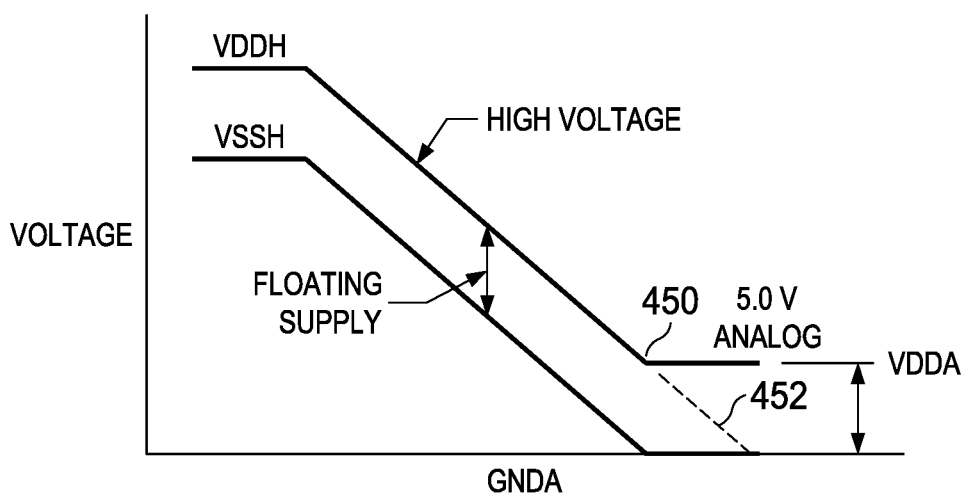
FIG. 4A illustrates a graph of the floating power supply and the fixed supply with the crossover operation.

Referring now to FIG. 4A, there is illustrated a graph depicting the voltage output of the floating power supply and its shift over to the fixed voltage output by the power supply 420. The upper rail voltage on the node 212 is labeled VDDH and the floating reference voltage is labeled VSSH. The voltage difference between VDDH and VSSH comprises the floating power supply voltage range and is equal to or less than the fixed operating voltage of the power supply 420 that operates over the voltage range between VDDA (the positive voltage of the fixed power supply 20) and GNDA (the reference or ground voltage level of the fixed voltage supply 420). The floating power supply voltage can be at least at a level sufficient to operate the low-voltage analog circuitry components which are utilized in the high-voltage section 412 (see FIGS. 5, 5A-C and FIGS. 6-9 described herein below). It is noted that these low-voltage analog circuitry components in the high-voltage section 412 can receive digital control signals that are generated by the digital control block 418 at a level between the floating reference voltage VSSH and the upper rail voltage VDDH, typically either VSSH or VDDH. They can be level shifted up to that range from VDDA and GNDA, respectively, via the level shifter 430. When the voltage on the node 212 falls down to a voltage that is approximately equal to the analog voltage level output by the power supply 420, the power supply voltage output by the cross-over level shifter 432 can jump or switch over to the fixed analog voltage output by the power supply 420 at a point 450. If there is no switch over, the voltage difference between VDDH and VSSH decreases when the floating voltage reference VSSH is equal to GNDA. This will be described in more detail herein below. Also, the level of the VSSH can be as low as the level at GNDA, the analog voltage ground, and the value of VDDH continues to fall as noted by a dotted line 452.

Referring now to FIG. 5, there is illustrated a circuit diagram of the CSM 220. The CSM 220 is divided into both the high-voltage section 412 and the low-voltage section 410. The isolation section 414 is comprised of two capacitors 502 and 504. This is a switched-capacitor amplifier. The high-voltage section 412 is comprised of a plurality of switches referred to as T-gate switches. They are operable to sample the voltage on either of the nodes (212 and 215) on either side of the sense resistor 214 to respective ones of the capacitors 502 and 504. There is provided a first T-gate 506 disposed between the node 212 and a node 508 interfaced with the high-voltage side of the capacitor 502. A second T-gate 510 is disposed between the node 215 and a node 512 interfaced with the high-voltage side of the capacitor 504. There is provided a T-gate 518 disposed between nodes 512 and 508. These three T-gates 506, 510, and 518 facilitate the sample and hold operation for the switched-capacitor amplifier operation. These T-gates operate on the high-voltage side but are implemented with low-voltage components and, thus, require a floating voltage that is less than the maximum voltage than would be present on either of the nodes 212 or 215.

As will be described herein below, there is also provided a T-gate 524 disposed between a positive reference voltage VPREF and the node 508. A complementary T-gate 526 is disposed between a negative reference voltage VNREF and the node 512. These two gates 524 and 526 are provided for calibration purposes. As noted hereinabove, the voltage across the sense resistor 214 and the nodes 212 and 215 can be as low as 20 mV. An input voltage can be provided across the positive and negative reference voltage inputs (VPREF, VNREF) of the T-gates 524 and 526 to calibrate the system.

On the low-voltage side 402, there are provided two differential amplifiers 528 and 530 disposed in series. The low-voltage side of capacitor 502 is connected to the negative input of amplifier 528 and the low-voltage side of the capacitor 504 is connected to the positive input of the amplifier 528. The common mode voltage input of the amplifier 528 is connected to a common mode voltage VCM which is disposed at a voltage approximately midway between VDDA and the analog ground GDNA, the voltage output by the low-voltage analog power supply 420. This VCM voltage is approximately 2.4 V in an exemplary embodiment. Each of the amplifiers 528 and 530 has supply inputs connected between VDDA and GDNA, i.e., they work on the low-voltage power supply 420 at the fixed voltage output therefrom.

A feedback capacitor 532 is disposed between the negative input of amplifier 528 and the positive output thereof (amplifiers 528 and 530 being inverting amplifiers) and an N-channel switched transistor 534 has the source/drain path thereof connected across the capacitor 532. Similarly, a feedback capacitor 536 is disposed between the positive input of the amplifier 528 and the negative output thereof. An N-channel switched transistor 538 has the source/drain path thereof connected across the capacitor 536. A feedback capacitor 540 is connected between the negative input of the amplifier 530 and the positive output thereof and an N-channel switched transistor 542 has the source/drain path thereof connected across the feedback capacitor 540. A feedback capacitor 544 is connected between the positive input of the amplifier 530 and the negative output thereof and an N-channel switched transistor 546 has the source/drain path thereof connected across the feedback capacitor 544. The common mode input to the amplifier 530 is also connected to VCM. The positive output of the amplifier 528 is connected to the negative input of the amplifier 530 through a gain adjust capacitor 548 and the negative output of the amplifier 528 is connected to the positive input of the amplifier 530 through a gain adjust capacitor 551.

The gain adjust capacitors 548 and 551 are programmable capacitor banks which each comprise capacitors of different capacitance values. By selecting these capacitors and the value thereof relative to the associated feedback capacitors 540 and 544, the gain of amplifier 530 can be selectively changed. Typically, the capacitors 540 and 544 each have a value of "C" and the selectable capacitors in each of the capacitor banks that form the gain adjust capacitors 548 and 551 can range in values such as "10C," "4C," "2C" and "C." In some embodiments, capacitors within the gain adjust capacitors 548 and 551 can be combined in a parallel configuration such that, for example, a value of "17C" could be provided. Again, the purpose of this configuration is to be able to adjust the gain of the amplifier 530. In some cases, both of the gain adjust capacitors 548 and 551 can be adjusted to the same value.

A double-ended to single-ended amplifier 550 is provided to amplify the output of the amplifier 530 and provide a single output on an labeled VCSM The positive output of the amplifier 530 is input to the negative input of the amplifier 550 through a series resistor 552 and, similarly, the negative output of the amplifier 530 is input to the positive input of the amplifier 550 through a series resistor 554. The feedback resistor 556 is disposed between the negative input of the amplifier 550 and the output thereof, the output thereof providing the amplified analog voltage VCSM.

Figure 5A:
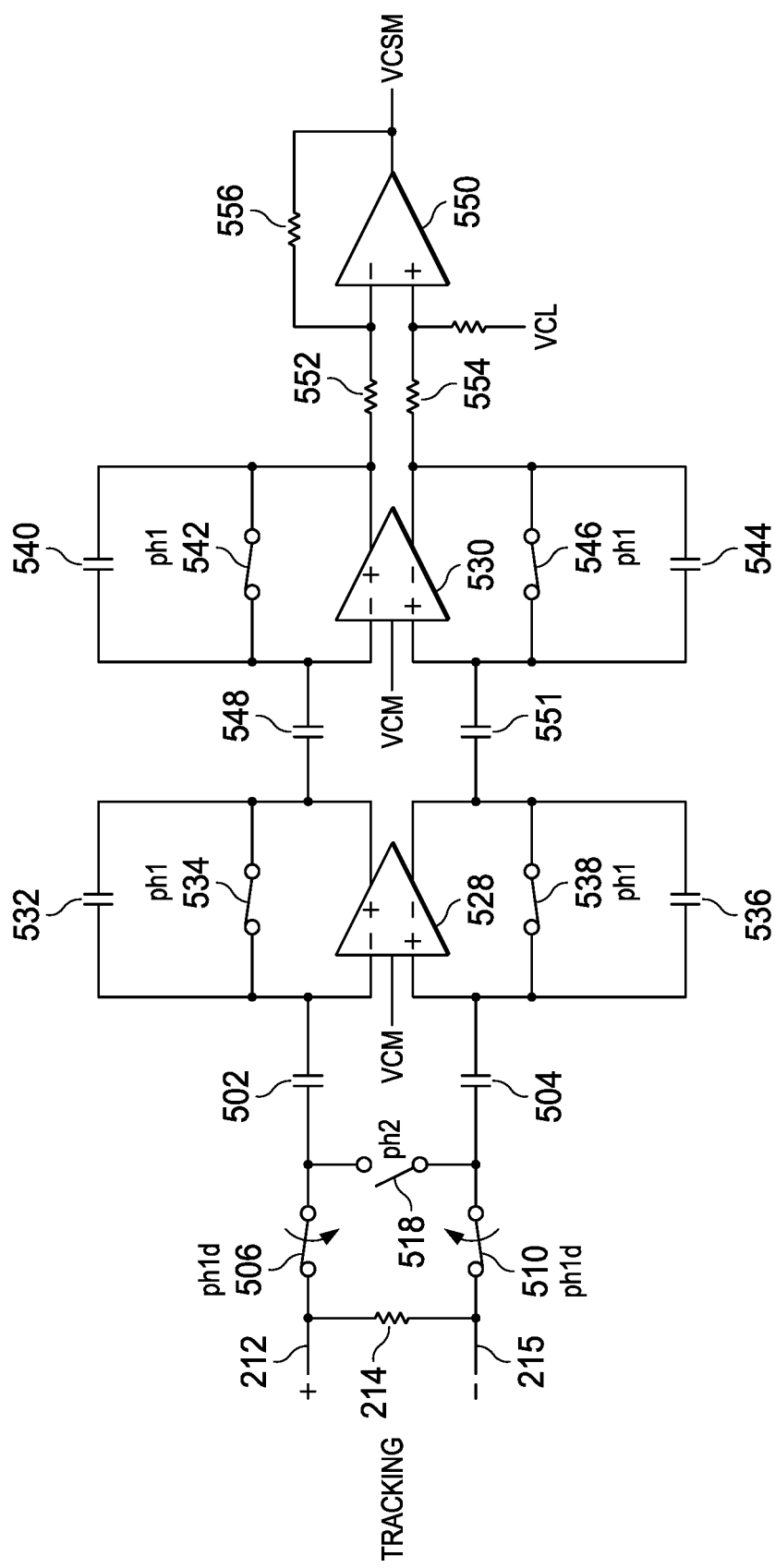
FIGS. 5A-5C illustrate the switched capacitor operation of the switched capacitor amplifiers during tracking/sampling/amplification.
Figure 5B:
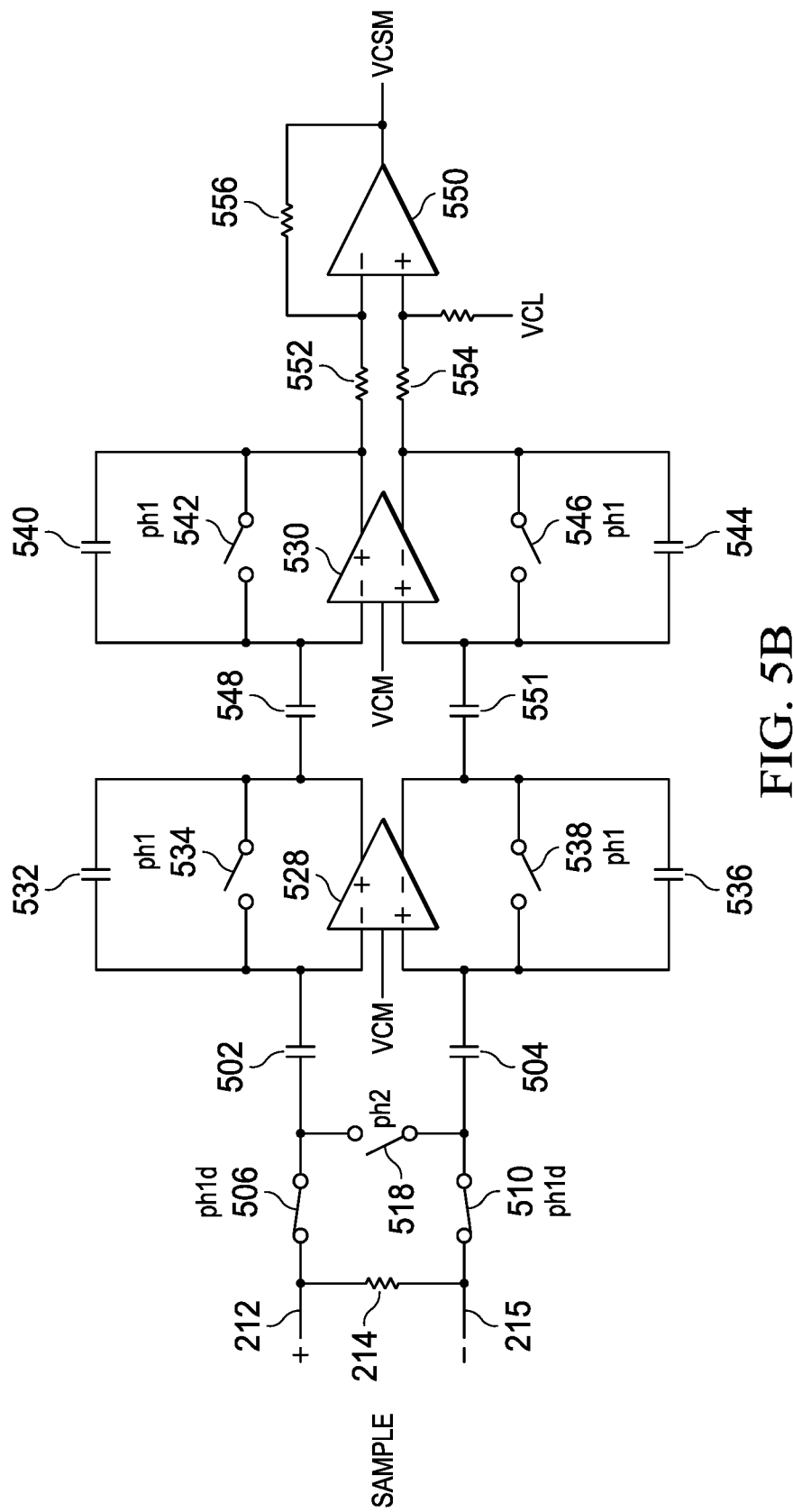
Figure 5C:
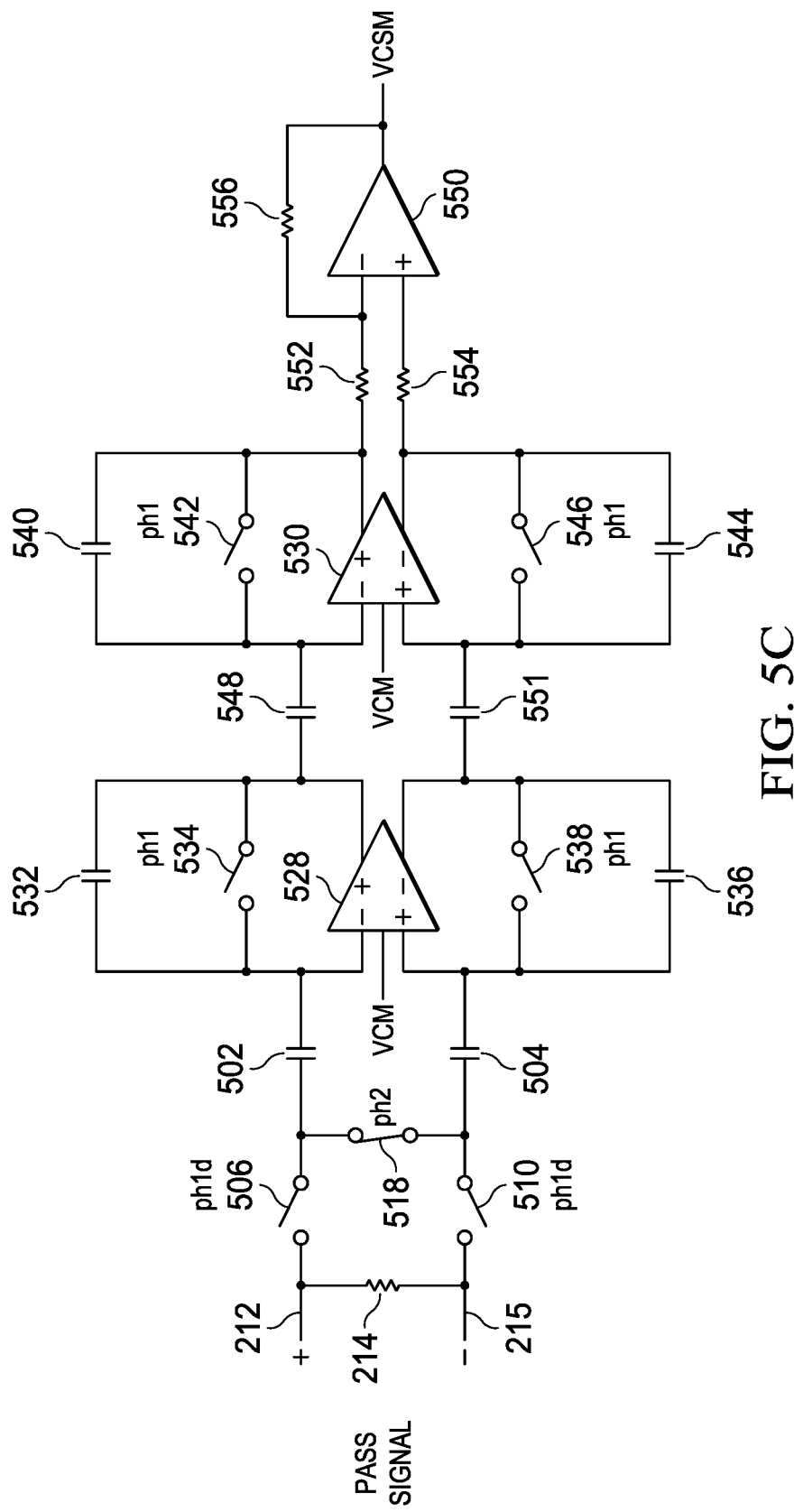

Referring now to FIGS. 5A-5C, there are illustrated the steps for operating the various switches in a high-voltage side and the low-voltage side. In the "tracking" phase illustrated in FIG. 5A, it can be seen that initially, the voltage across the sense resistor 214 is disposed on the respective high-voltage plates of the capacitors 502 and 504 with the switches 506 and 510 being in a closed position and the switch 518 being open. The high-voltage plates of the capacitors 502 at 504 are connected through the respective switches 506 and 510 to the respective nodes 212 and 215 and charge flows to/from these nodes 212 and 215 to the respective high voltage plates of the capacitors 502 and 504. On the low-voltage side, the low voltage plates of feedback capacitors 532 and 536 associated with the amplifier 528 are shorted to the respective outputs of the amplifier 528 by the switches 534 and 538 being in a closed position. This renders the amplifier 528 a unity gain amplifier. Similarly, the plates of capacitors 540 and 544 connected to the respective negative and positive inputs of amplifier 530 are shorted by switches 542 and 546 to the respective outputs of the amplifier 530 to render that amplifier 530 a unity gain amplifier. Thus, the voltage on the positive and negative outputs of both of the amplifiers 528 and 530 can be the amplified common mode voltage. The switches 534, 538, 542, and 546 are controlled by a switch control signal ph1 and the switches 506 and 510 are controlled by a delayed version of ph1, ph1$d$. The switch 518 is controlled by a switch control signal ph2. These control signals are the switching phases for the switched capacitor operation, as will be described herein below.

In this "tracking" phase, the voltage on each of the positive and negative inputs of the amplifier 528 is held at the common voltage VCM plus/minus an offset VOFF. Thus, the voltage on the negative input would be VCM−VOFF/2 and the voltage on the positive input would be VCM+VOFF/2. At this stage, it can be seen that both of the switches 506 and 510 are closed and, thus, the voltage on node 212 is applied to the high-voltage plate of capacitor 502 and the voltage on node 215 is applied to the high-voltage plate of capacitor 504. As noted hereinabove, the voltage across resistor 214 could be approximately 20 mV. If the high-voltage level is around 20 V, then the voltage on node 212 could be 20 V and the voltage on node 215 would be 19.980 V, a difference of 20 mV. Since the voltage on the low-voltage plates of the capacitors 502 and 504 is VCM+/−VOFF, there can be a difference in charge at each of these two capacitors. The charge is defined by the relationship Q=CV. At this point, there is no charge stored on the feedback capacitors 532 and 536 (also referred to as the integration capacitors) since the switches 534 and 538 are closed.

In the second step of the operation, the "sampling" phase, as illustrated in FIG. 5B, the amplifiers 528 and 530 are placed into the open loop mode by opening switches 534 and 538 on amplifier 528 and the switches 542 and 546 on amplifier 530 by changing the state of the signal ph1, but the switches 506 and 510 remain closed, as the state of the signal ph1$d$ has not changed, as this is the delayed version of ph1. At this point, no change occurs at the node associated with the negative and positive inputs to the amplifier 528, on the low-voltage plates of the capacitors 502 and 504 or to the plates of capacitors 532 and 536 connected to the inputs of amplifier 528.

In the next step, in FIG. 5C, the signal ph1$d$ changes the state of switches 506 and 510 so that they open and the signal ph2 changes the state of switch 518 and switch 518 closes. This shorts the two high-voltage plates of capacitors 502 and 504 together, causing the charge between the two capacitors 502 and 504 to redistribute. Since the capacitors 502 and 504 are considerably larger than the capacitors 532 and 536 by, for example, a factor of 100 and since the voltage on the negative and positive inputs of the amplifier 528 remains substantially the same at VCM+/−VOFF, this redistribution of charge can change the voltage on the positive and negative outputs of the amplifier 528. This can result in amplification of the voltage difference that was originally across the high-voltage plates of the capacitors 502 and 504. Since the voltage on the capacitors 548 and 551 changes as a result, this can also cause a redistribution of charge to the capacitors 540 and 544 in accordance with the ratio between the capacitors 544 and 540 and the corresponding capacitors 551 and 548, noting that the gain of the amplifier is defined in terms of the ratio of the input capacitor(s) (548/551)—CIN—and the feedback capacitor(s) (540/544)—CFB—by the relationship VOUT/VIN≈CIN/CFB. The capacitors 548 and 551 are considerably larger than the integration or feedback capacitors 540 and 544, the ratio thereof defining the gain of the amplifier 530. This is an amplification operation of the output of the amplifier 528, which is then amplified again by amplifier 550.

It is noted that, during this operation, the charging and discharging of the capacitors associated with the low-voltage side is facilitated by charge flowing to/from the low-voltage power supply, wherein the switches on the high-voltage side allow charge to flow to/from the high voltage nodes 212 and 215 to/from the respective high-voltage plates of the capacitors 502 and 504. The high-voltage (floating) power supply operates to define the high voltage domain which allows the digital switching voltages and the sensed analog voltage value input to the T-gates 506, 510, 518, 524 and 526 to exist within a voltage domain. For example, if the voltage on node 212 is 20V and the voltage on node 215 is 19.980V, and the level shifted digital control signals switch between 20V and 15V, then the high-voltage supply disposed between the voltage of 20V on node 212 and a floating reference voltage of 35V is sufficient to ensure that the T-gates 506, 510, 518, 524 and 526 fully turn off or fully turn on. There is little change in the overall charge, as the voltage on the high-voltage plates of capacitors 502 and 504 stay approximately at the high-voltage level of, for example, 20 V and the low-voltage plates of the capacitors 502 and 504 remains substantially at the voltage VCM+/−VOFF.

By comparison, when the switches 534, 538, 542, and 546 open, then the amplifiers 528 and 530 drive their respective positive/negative outputs from the common mode voltage to higher/lower voltage as a result of the charge redistribution to the respective capacitors 532, 536, 540, and 544 during the sampling phase and the amplification phase. The power requirements for this operation include a driving current to the respective output nodes from fixed power supply 420 during the sampling and amplification phases to allow for charging the feedback capacitors and allowing the outputs to settle. If the amplifiers 528 and 530 were disposed in the high voltage domain, this may require a heavier load on the floating power supply.

In operation, the switches 506, 510, and 518 and the capacitors 502 and 504 operate as a level translator. These components translate the voltage that is disposed across the resistor 214 to the output of the amplifier 528 through distribution of charge to the capacitors 532 and 536, to provide an amplified voltage on the output of amplifier 528. This level translation allows the switched capacitor amplifier to operate in the low-voltage domain with the actual voltage transferred from opposite sides of the resistor 214 to the upper plates of the capacitors 502 and 504 to charge them accordingly. This operation can operate at any voltage higher than the voltage of the low-voltage domain. The common mode voltages for the amplifiers 528 and 530 are insensitive to the voltage in the high-voltage domain for this operation. Operations such as auto-zeroing associated with the operation of the switched capacitor amplifier can be performed in the low-voltage domain independent of the absolute voltage on either side of the resistor 214.

Figure 6:
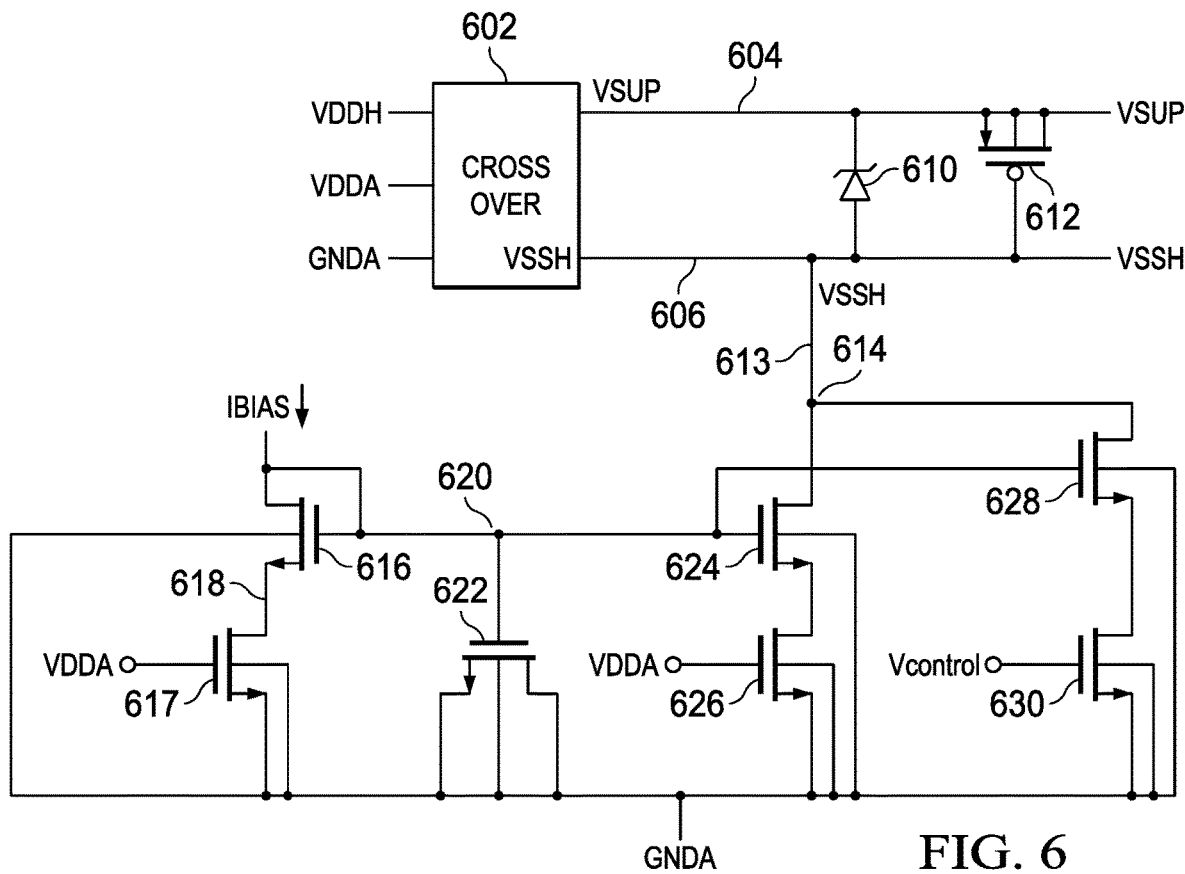
FIG. 6 illustrates a schematic diagram of the floating power supply.

Referring now to FIG. 6, there is illustrated a schematic diagram of the floating power supply, which provides the voltage output on the line 436 when the voltage on node 212 is above the fixed voltage of the power supply 420 shown in FIG. 4A. A crossover switch 602 is provided to receive the high-voltage power supply voltage VDDH and the analog low-voltage power supply voltage VDDA on respective inputs thereto. Additionally, the analog ground GNDA is also provided as an input. The output of the crossover switch 602 is provided on a node 604 as the supply voltage VSUP and the high-voltage reference VSSH is provided on a node 606. The supply voltage VSUP is the high side voltage level provided to the high voltage section 412 and the ground reference voltage provided to the high voltage section is VSSH. It is noted that VSSH will approximately equal GNDA after the switchover, as will be described hereinbelow. Disposed between nodes 604 and 606 is a Zener diode 610 having the anode thereof connected to node 606 and the cathode thereof connected to node 604. The breakdown voltage across this Zener diode 610 is approximately 5.0 V or less. Thus, the voltage across the nodes 604 and 606 does not exceed the Zener diode breakdown voltage.

There is provided a transistor 612 having the source/drain path thereof connected together and to the node 604 and the gate thereof connected to the node 606, the gate forming a P-channel transistor capacitor. This provides some capacitance to supply current to the output VSUP on node 604. In order to provide bias for the Zener diode 610, a bias current is sourced through a line 613 to a node 614. This bias current through the line 613 is provided with a current mirror. The current mirror is comprised of an N-channel transistor 616 having the source thereof connected to a node 618 and the drain thereof connected to a node 620 and having a bias current IBIAS input to the drain of transistor 616, and the gate and drain thereof connected together in a diode configuration. The node 618 is connected to one side of the source/drain path of an N-channel transistor 617, the other side thereof connected to analog ground GNDA and the gate thereof connected to a VDDA. Node 620 is connected to one side of the capacitor configured N-channel transistor 622, the other side thereof connected to GNDA. Node 620 is connected to the gate of an N-channel transistor 624, the source/drain path thereof connected between node 614 and one side of the source/drain path of an N-channel transistor 626. The other side of the source/drain path of transistor 626 is connected to analog ground GNDA and the gate thereof connected to a VDDA. Node 614 is also connected to one side of the source/drain path of an N-channel transistor 628, the other side thereof connected to one side of the source/drain path of an N-channel transistor 630, the other side of the source/drain path of transistor 630 connected to the analog ground GNDA and the gate thereof connected to a control voltage Vcontrol. Thus, the current provided through the transistors 616 and 617 is mirrored over to the series connected transistors 624 and 626 and series connected transistors 628 and 630 when transistor 630 is turned on with the control voltage Vcontrol. This provides a bias current sufficient to turn on the Zener diode 610. However, the voltage on the node 606, the reference side voltage VSSH for the high-voltage supply, may not be pulled down below the supply voltage VSUP on the node 604 by more than the Zener diode breakdown voltage of Zener diode 610. Thus, as the voltage VDDH varies from a high-voltage of, for example, 20 V on the node 212 down to a voltage above the low-voltage power supply, the voltage across nodes 604 and 606 will not exceed the Zener breakdown voltage of the Zener diode 610. However, when the node 606 is sufficiently low to be less than the breakdown voltage of the Zener diode 610, the Zener diode 610 can start to turn off. The result is that the voltage between the node 604 and the node 606 could decrease below the required voltage if the node 604 were connected to VDDH and VDDH fell below VDDA. Switching to VDDA allows the voltage between node 604 and 606 to not decrease below a certain value when VDDH falls below VDDA. When VDDH is above VDDA, the voltage across nodes 604 and 606 is maintained at the breakdown voltage of the Zener diode 610 as long as the voltage VDDH is above the voltage VDDA. This is the purpose of the crossover switch 602, which will be discussed with respect to FIG. 7.

Figure 7:
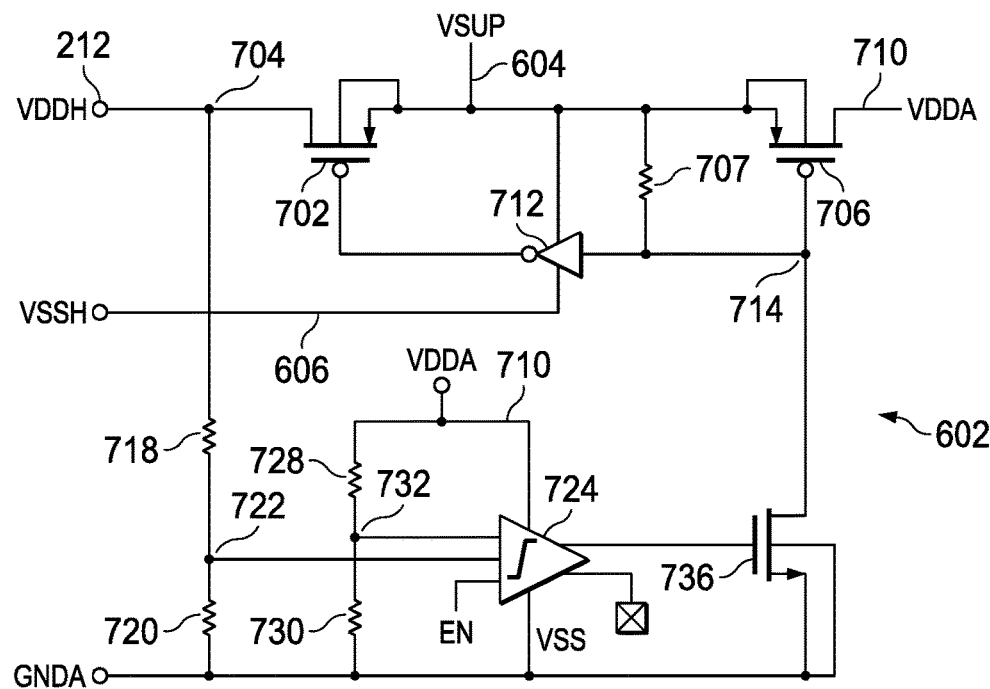
FIG. 7 illustrates a schematic diagram of the crossover circuit.

Referring now to FIG. 7, there is illustrated a schematic diagram of the crossover switch 602. Node 604 is connected to one side of the source/drain path of a P-channel transistor 702, the other side thereof connected to a node 704 associated with the voltage VDDH; node 704 is also associated with the high-voltage node 212 on the high side of the sense resistor 214. The transistor 702 is connected such that the bulk thereof is connected to the source and the drain is connected to the node 704. A second P-channel transistor 706 has the source thereof connected to node 604 and the drain thereof connected to a node 710 associated with the analog voltage VDDA. The bulk of transistor 706 is connected to the source thereof. The gate of transistor 702 is connected to the output of an inverter 712, the input thereof connected to a node 714 which is connected to the gate of transistor 706. The inverter 712 has the positive supply voltage thereof connected to the node 604 and the reference supply voltage level connected to the high-voltage reference VSSH on node 606. Thus, the inverter 712 is powered by whatever voltage is disposed across nodes 604 and 606.

The high-voltage VDDH on the node 704 is connected through a resistor divider comprised of two series connected resistors 718 and 720 with a tap node 722 providing a divided voltage for input to a comparator 724 having hysteresis. Similarly, the voltage VDDA on the node 710 is divided down by a resistor divider comprised of two series connected resistors 728 and 730, the divided voltage on a tap node 732 being input to the other input of the comparator 724. The comparator 724 has a positive power supply input connected to node 710 and the reference or VSS input thereof connected to the analog ground GNDA, thus being powered from the low-voltage side. When the voltage VDDH on the node 704 falls very close to the level that is just above VDDA, the output of the comparator 724 drives the gate of an N-channel transistor 736 high, turning on the transistor 736, with the source thereof connected to analog ground GNDA and the drain thereof connected to the node 714, thus pulling the gate of transistor 706 low and turning such on. When the node 714 is pulled low, the output of inverter 712 goes high, turning off transistor 702. It is noted that the transistor 706 can have the voltage VDDH on one side of the source/drain path thereof and the voltage VDDA on the other side thereof when the transistor 706 is turned off. This could result in a high-voltage across such transistor, thus it would be beneficial for transistor 706 to be a relatively high-voltage transistor. A resistor 707 is disposed between the node 604 and the node 714, which can pull the gate of transistor 706 up to the node 604 when the transistor 736 is off, thus turning off transistor 706. However, this means that node 714 can be high and, thus causing the source of transistor 736 to be high, potentially at VDDH. Thus, it is advantageous for transistor 736 to also be a high-voltage transistor.

Figure 8:
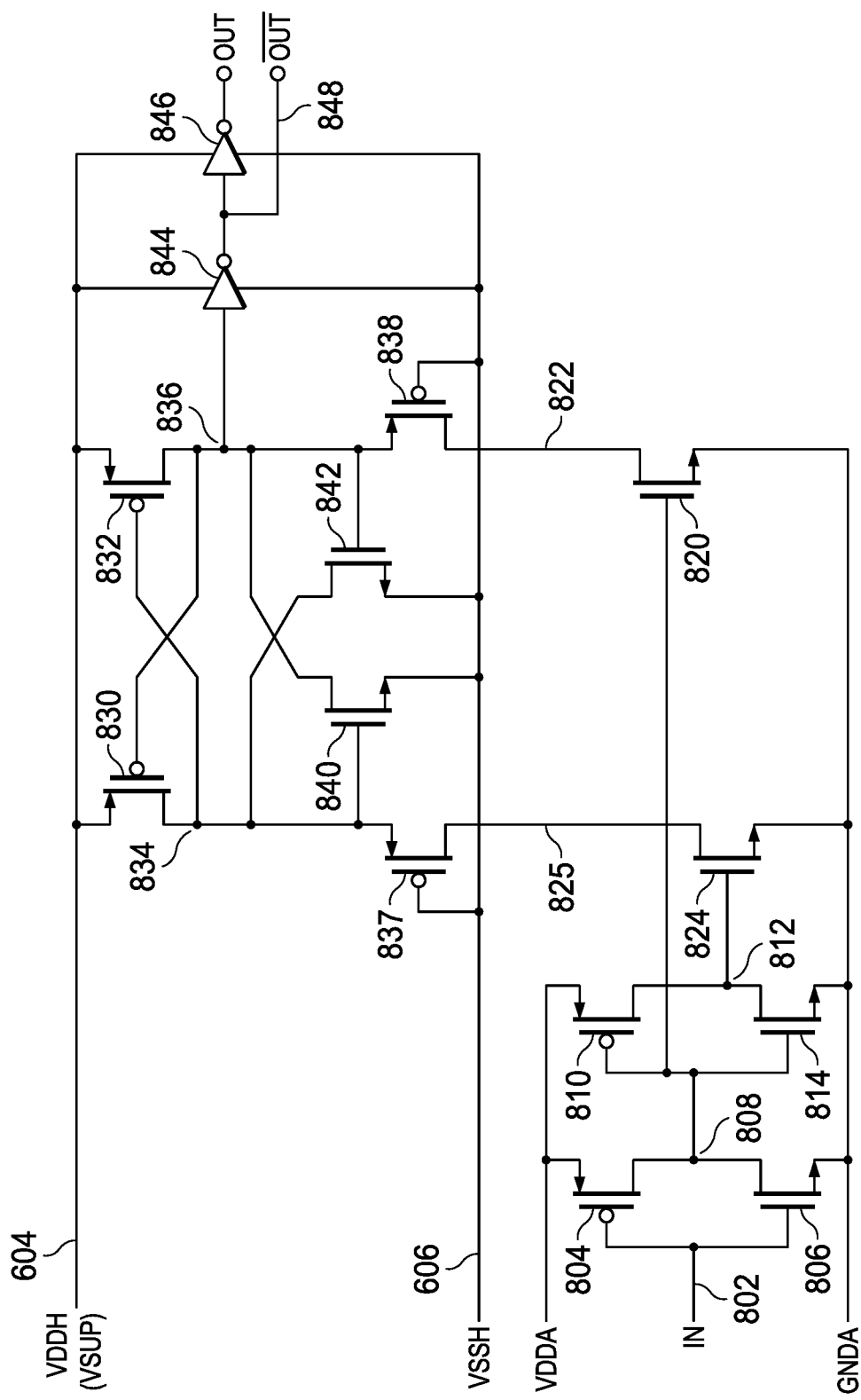
FIG. 8 illustrates a schematic diagram for the level shifter.

Referring now to FIG. 8, there is illustrated a schematic diagram for converting a digital control signal generated on the low-voltage side 402 to a digital control signal on the high-voltage side 404. A control voltage input signal, such as ph1 is input on a node 802 to the input of a first inverter comprised of two series connected transistors, a P-channel transistor 804 connected in series with an N-channel transistor 806 connected between VDDA and GNDA, with the P-channel transistor 804 connected between VDDA and the output node 808 and a N-channel transistor 806 connected between node 808 and GNDA, with the gates thereof connected to node 802. The node 808 is connected to the input of a second inverter comprised of two series connected transistors, a P-channel transistor 810 connected between VDDA and a node 812 and an N-channel transistor 814 connected in series between node 812 and GNDA, the gates thereof connected to node 808. The output of the first inverter on node 808 is connected to drive an N-channel transistor 820 having the source/drain path thereof connected between a node 822 and GNDA. The output of the second inverter on the node 812 is connected to the gate of an N-channel transistor 824, the source/drain path thereof connected between a node 825 and GNDA.

The selected voltage output on node 604 from the crossover switch 602 of FIG. 7 is VSUP and is illustrated in this configuration to be VDDH, but the voltage VSUP is understood to be the output of the highest one of the power supply voltages VDDH or VDDA. This voltage on the node 604 is connected to the sources of two P-channel transistors 830 and 832 connected in a cross coupling latch configuration. The transistor 830 has the source/drain path thereof connected between node 604 and a latch node 834. The P-channel transistor 832 has the source/drain path thereof connected between the node 604 and a latch node 836. The gate of transistor 830 is connected to latch node 836 and the gate of transistor 832 is connected to the latch node 834. A P-channel transistor 837 has the source thereof connected to the node 834 and the drain thereof connected to a node 825 to the drain of transistor 824, and the gate of transistor 837 is connected to VSSH on node 606. A P-channel transistor 838 has the source thereof connected to node 836, the drain thereof connected to node 822 and the gate thereof connected to VSSH on node 606. A weak latch is provided with two N-channel transistors 840 and 842. N-channel transistor 840 has the drain thereof connected to latch node 836, the source thereof connected to VSSH on node 606 and the gate thereof connected to latch node 834. N-channel transistor 842 has the drain thereof connected to latch node 834, the source thereof connected to VSSH on node 606 and the gate thereof connected to latch node 836. The latch node 836 comprises the output of the latch, which is input to the input of an inverter 844, the output thereof connected to the input of a second inverter 846, and the output thereof providing the signal output at the level shifted output. If, for example, the control signal on the input were ph2, then the output from inverter 846 would be ph2 slightly delayed from the input on node 802 and the inverted output would be provided from the output of the inverter 844 on a node 848.

When the signal on the node 802 is raised to a logic high, this pulls node 808 low, turning off transistor 820 and removing the current sink from node 822. Node 808 going low pulls the gate of transistor 810 low, thus turning transistor 810 on and transistor 814 off; this further raises node 812 high and turns on transistor 824 to pull node 825 low. When node 825 goes low, this pulls the drain of transistor 837 low, allowing current to pass and pulling node 834 low. This turns on transistor 832, pulling node 836 high.

Node 836 going high turns off transistor 832 latching a logic high on node 836. This results in a logic high on the output of inverter 846 and a logic low on the output of inverter 844 to control associated T-gates, noting that this output from latch 848 provides one of the digital control signals ph1d or ph2 used to control the gates 506, 510, 518, 524 and 526. When node 834 goes low, transistor 840 turns off to allow node 836 to go high, which turns on transistor 842 pulling current from node 834 to the VSSH node 606. As noted hereinabove, transistors 840 and 842 provide a latch to maintain the logic state on node 836.

When the logic state on node 802 goes low, this turns on transistor 804 and can pull node 808 high, turning on transistors 814 and 820, pulling nodes 812 and 822 low, and turning off transistor 824. Turning off transistor 824 allows node 825 to "float." Turning on transistor 820 can pull node 836 low, as a result of the drain of P-channel transistor 838 pulled below the gate voltage thereof, when VSSH on node 606 is above GNDA. Conduction through the source/drain path of transistor 838 can then turn on transistor 830 and pull node 836 low, turning off transistor 842 and turning on transistor 830 and pulling node 834 high. This can result in the logic state on the output of inverters 844 and 846 to switch to the opposite logic state. This ensures that the logic state on the output of inverters 844 and 846 is confined to the voltage range between nodes 604 and 606, i.e., the low logic state is VSSH and the high logic state is VDDH.

When the logic state on node 802 goes high, the opposite operation occurs to that described hereinabove with node 825 being pulled low, turning on transistor 837 and pulling node 834 low, turning on transistor 832 and pulling node 836 high. This turns on transistor 842 latching node 834 low and node 834 going low turns off transistor 840 latching node 836 high.

The above operation is described with respect to voltage on node 604 (VSUP) being at the voltage VDDH selected from the node 704 by the crossover circuit 602 by turning on transistor 702 (See FIG. 7). With specific reference to FIG. 6, when the voltage on node 212, VDDH, begins to decrease in value to a point wherein the voltage on VSUP (with the condition existing wherein VDDH is the selected voltage on node 604 selected by the crossover circuit 602) is equal to approximately the Zener breakdown voltage of the Zener diode 610, the voltage VSSH on node 606 will be pulled to the reference voltage on GNDA through transistors 624 and 626. As the voltage VSUP continues to decrease, the current flowing through the Zener diode 610 will decrease and eventually go to zero. With specific reference to FIG. 7, when the voltage on node 722, the divided voltage VDDH, falls below the voltage on node 732, the divided voltage VDDA, the transistor 736 is turned on, and the voltage VDDA will be selected by transistor 706 for output on node 604 as VSUP. With specific reference to FIG. 8, when VSSH on node 606 is substantially equal to the voltage GNDA, both transistors 837 and 838 will be turned on. This will then allow transistors 824 and 820 to control the voltage on respective nodes 834 and 836. In this configuration, the digital output voltage on the outputs of inverters 844 and 846 will be digital voltages that range between GNDA and VDDA, i.e., digital voltages that are confined within the first voltage domain.

Figure 9:
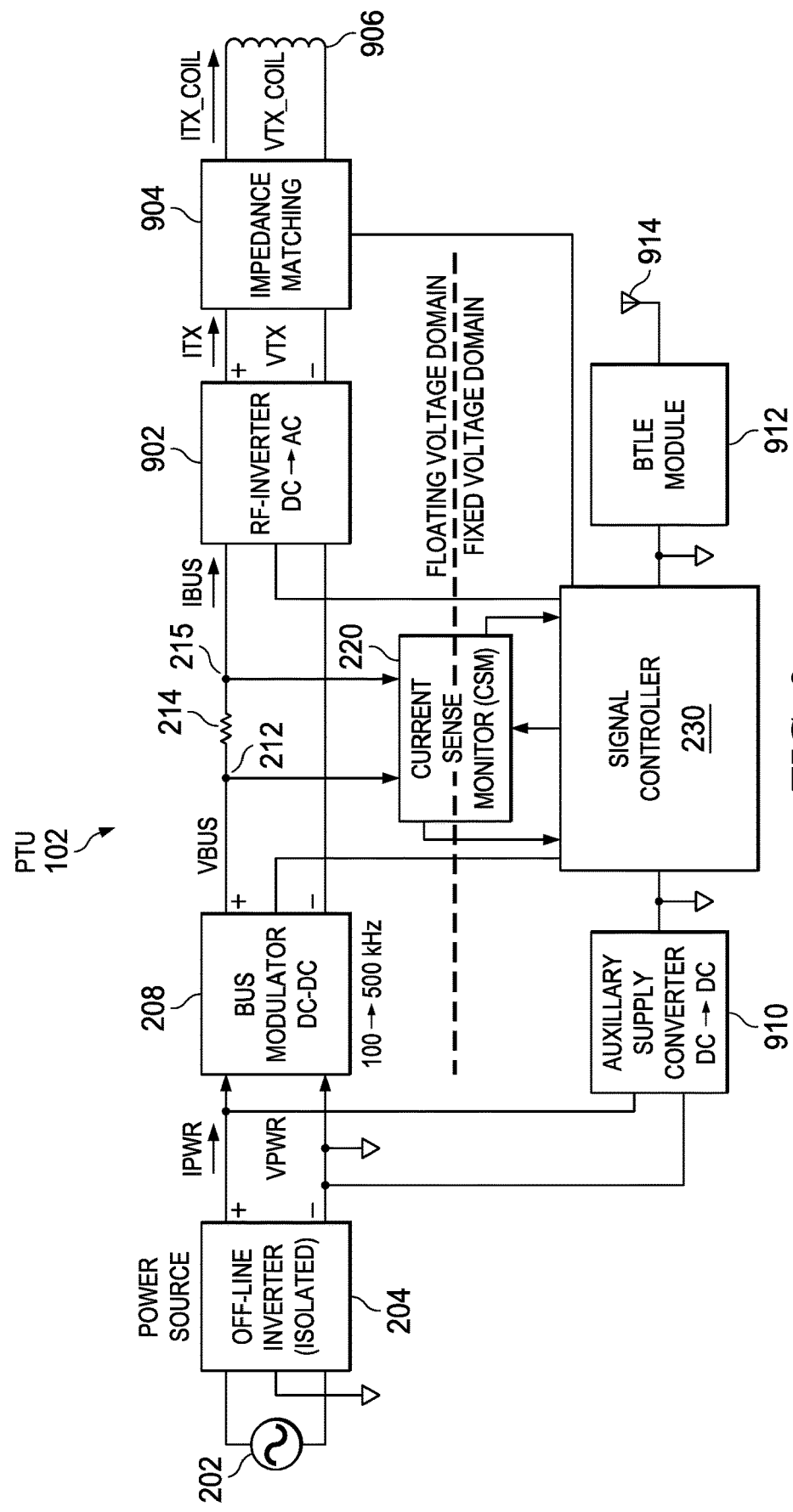
FIG. 9 illustrates a block diagram of an exemplary wireless power transmitter.

Referring now to FIG. 9, there is illustrated a block diagram of the wireless power transmitter illustrated above in FIG. 2 with respect to the Tx side only. The output of the bus modulator 208 is illustrated as providing the voltage VBUS and the current IBUS to an RF inverter 902. The RF inverter 902 is operable to convert the DC voltage to an AC voltage for transmitting to a transmit coil 906. The output of the RF inverter 902 is provided to an impedance matching circuit 904 to match the impedance of the transmit coil 906 to its surrounding environment. The driving voltage VTX output by the RF inverter 902 drives the coil 906 with an AC signal and a current ITX. The signal controller 230 is powered by an auxiliary power supply input from an auxiliary supply converter 910, which is a DC-to-DC converter. The signal controller 230 interfaces with a communications module 912, which can be a Bluetooth Low Energy (BLE) communications module that interfaces with an antenna 914. This antenna 914 can communicate with a receiving unit (not shown).

It can be seen that the signal controller 230 operates in the fixed voltage domain which is associated with the low-voltage section. As such, the digital circuitry in the low-voltage section is configured to operate at a fixed low voltage generated by the auxiliary supply converter 910. Since the voltage VBUS is a floating voltage that can range from voltage well above to below the fixed voltage that is associated with the operation of the signal controller 230, this section is indicated as existing within a floating voltage domain, i.e., the high-voltage section. The Current Sense Monitor (CSM) 220 is illustrated as bridging the two voltage domains, the fixed voltage domain and the floating voltage domain. This allows the CSM 220 to interface with the nodes 212 and 215 and be controlled by the signal controller 230 in both voltage domains. Additionally, it can be seen that the signal controller 230 can also control the bus modulator 208, the RF inverter 902, and the impedance matching circuit 904.

Figure 10:
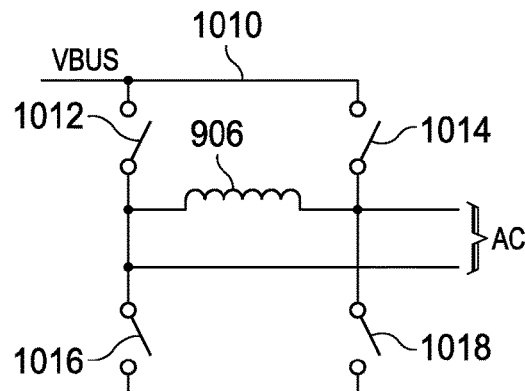
FIG. 10 illustrates a schematic diagram of an exemplary RF converter.

Referring now to FIG. 10, there is illustrated a schematic diagram of the RF inverter 902. The voltage output by a bus modulator 208, VBUS, is input on a node 1010 to the input of two switches 1012 and 1014. In some embodiments, the switches can be connected on either side of the coil 906. In other embodiments, the switches can be connected to inputs of the impedance matching circuit 904. There are provided two switches 1016 and 1018 which are connected from both sides of the coil 906 to ground. The switches are controlled to generate an AC voltage at a frequency of 6.78 MHz The current through the coil 906 can be maintained at approximately a constant current with a variable voltage VBUS operable to vary the power delivered to the coil 906. By monitoring the current with the current sense resistor 214 and the CSM 220, it is possible to maintain this current at a constant level through the coil 906 while delivering power to the receiving unit via the coil 906. The switches 1012-1018 can be controlled by the signal controller 230.

Figure 11:
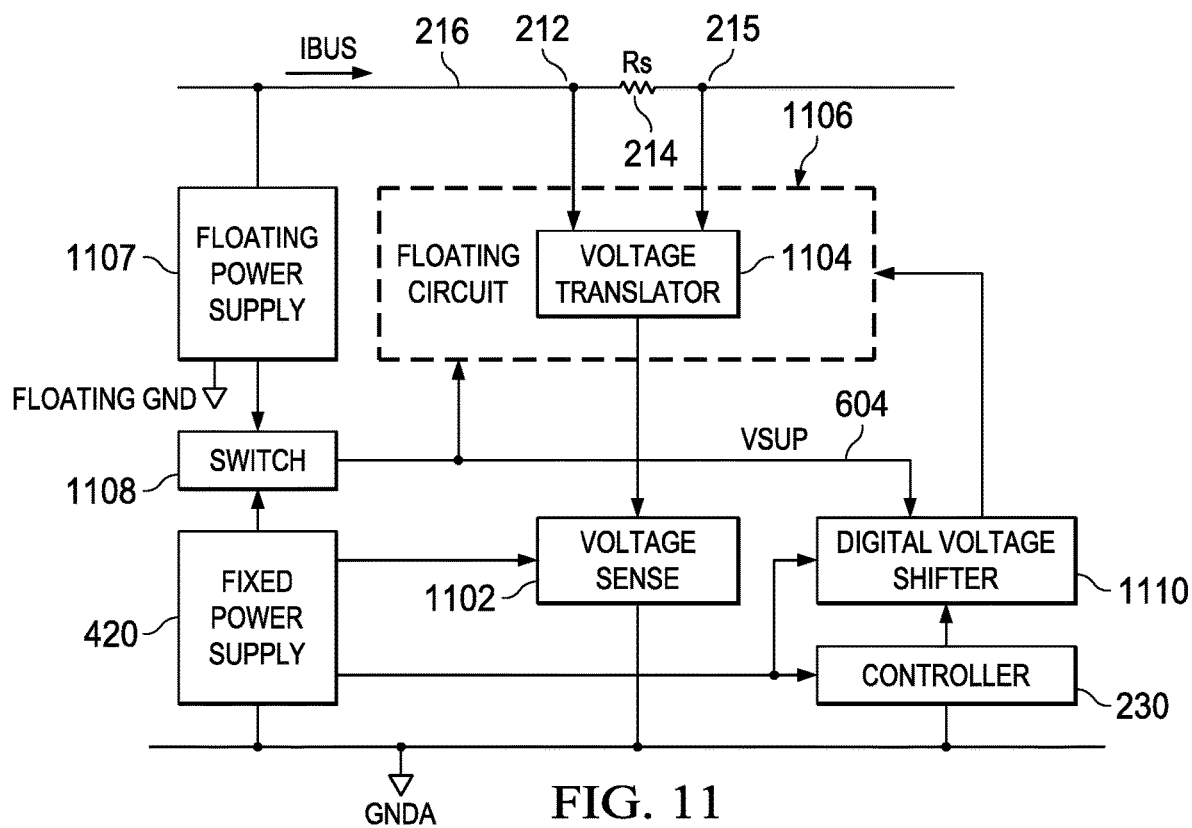
FIG. 11 illustrates a simplified diagrammatic view of the above-described system wherein the voltage sensor is disposed in the low voltage domain.

Referring now to FIG. 11, there is illustrated a simplified diagrammatic view of the system described hereinabove wherein the voltage sense portion of the current sense monitor 220 is disposed in the low-voltage domain. In this embodiment, a voltage sense circuit 1102 is disposed within the low-voltage domain and receives power from the fixed power supply 420 at the voltage level of the fixed power supply 420. The voltage sense circuit 1102 is comprised of the portion of the switched capacitor amplifier including the amplifiers 528 and 530 in the low-voltage domain 402 of FIG. 5. The capacitors 502 and 504 and the switches 506, 510 and 518 disposed in the high-voltage domain 404 form a voltage translator 1104 disposed in the high-voltage domain as a floating circuit 1106. This floating circuit 1106 is powered by either a floating power supply 1107 or the fixed power supply 420 as selected by a switch 1108. This switch 1108 corresponds to the crossover 602 in FIG. 6. The controller 230 exists within the low-voltage domain and is operable to generate digital control signals which are then input to a digital voltage shifter 1110 to output level translated digital voltages from the low-voltage domain to the high-voltage domain and, when the switch 1108 switches to the output of the fixed power supply, the output of the digital voltage shifter 1110 is also connected to the output of the switch 1108. This was described hereinabove with respect to the circuit of FIG. 8. In operation, as described hereinabove, the sensed voltage across the resistor 214 is translated down to the low-voltage domain from the high-voltage domain for processing by the voltage sense circuit 1102. The voltage translator 1104 has active devices disposed therein that are rated within the range of the floating power supply 1107 or the fixed power supply 420. The two capacitors associated with the switched capacitor amplifier of FIG. 5, capacitors 502 and 504, are rated at the maximum voltage of the high-voltage domain and facilitate the level translation of the voltage across the resistor 214 to a voltage across the positive and negative outputs of the amplifier 528 in accordance with the operation of the switched capacitor amplifier.

Figure 12:
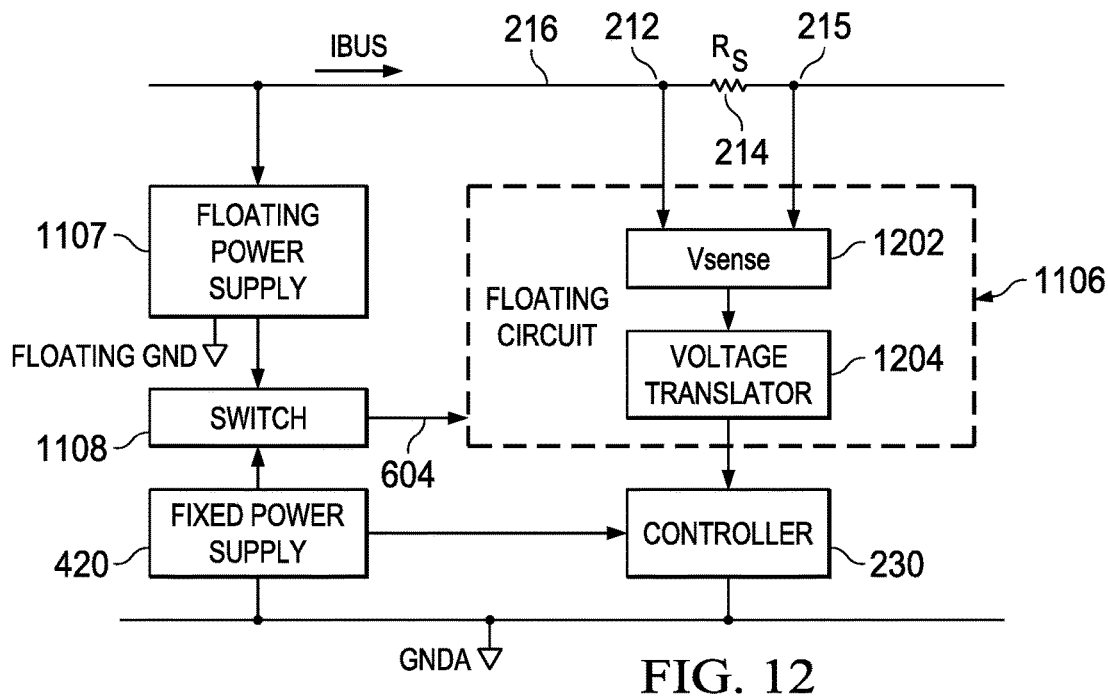
FIG. 12 illustrates a simplified schematic view of the above-described system wherein the voltage sensor is disposed in the high voltage domain.

Referring now to FIG. 12, there is illustrated an alternate embodiment wherein the voltage sense operation is facilitated in the floating circuit 1106 in the high-voltage domain. In this operation, a voltage sense circuit 1202 is operable to receive as inputs the voltage across the resistor 214 on nodes 212 and 215 and provided as an output to a voltage translator 1204 to level translate that voltage down to an input to the controller 230 in the low-voltage domain. In this operation, the circuitry associated with the floating circuit 1106 including active devices or passive devices will be rated at least at the voltage rating of the highest of the floating power supply 1107 or the fixed power supply 420. This allows the voltage sensing operation to occur in the high-voltage domain, but the processing by the controller 230 occurs in the low-voltage domain. As the voltage on the node 216 falls below the output voltage level of the fixed power supply 420, the switch 1108 will switch the operation of the floating circuit 1106 over to the output voltage of the power supply 420.

Figure 13:
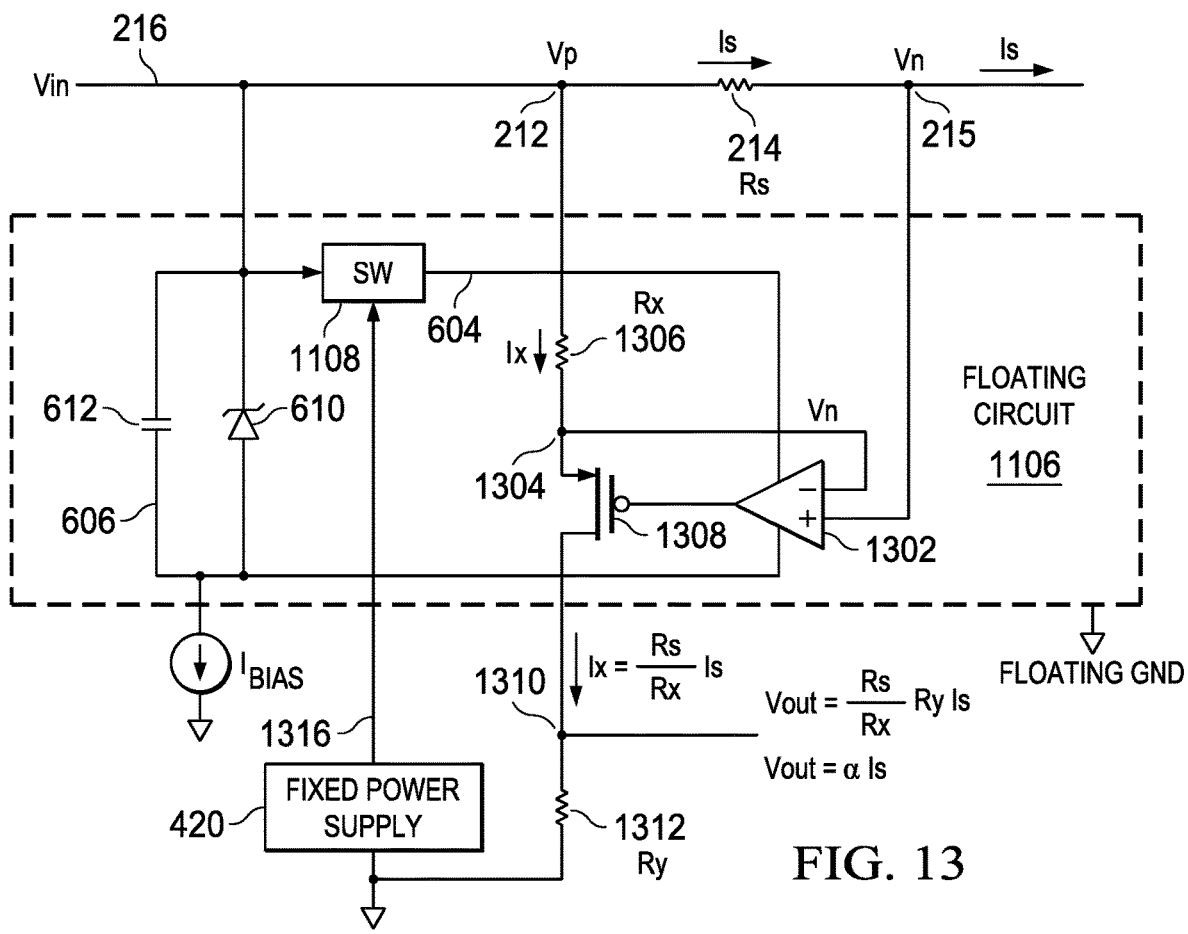
FIG. 13 illustrates a schematic diagram of the voltage sensor in the high voltage domain of FIG. 12.

Referring now to FIG. 13, there is illustrated a schematic diagram of the voltage sense circuit 1202 and the voltage translator 1204 of FIG. 12. Generally, the circuit utilizes a transimpedance amplifier which is a current-to-voltage converter. A differential input amplifier 1302 has the positive input thereof connected to the node 215 to receive the voltage Vn on the input thereof. The negative input thereof is connected to a node 1304 which is connected through a resistor Rx 1306 to node 212 to the voltage Vp. The negative input of the differential amplifier 1302 is held equal to the voltage on the positive input as a result of the high open loop gain thereof, and is thus labeled Vn, the voltage on the positive input of the differential input amplifier 1302. The positive supply node of the amplifier 1302 is connected to the node 604 on the output of the switch 1108 and the ground supply node of the amplifier 1302 is connected to the floating ground on node 606. The output of the amplifier 1302 is connected to the gate of a P-channel transistor 1308, the source thereof connected to the node 1304 and the drain thereof connected to an output voltage node 1310. This transistor 1308 is a high voltage rated transistor, as the full voltage between node 216 and analog ground can be disposed across the source/drain path thereof. The amplifier 1302 is a voltage-to-current converter that drives an output current labeled Ix through a load resistor Ry 1312, where load resistor 1312 is a resistor that is disposed in the low-voltage domain and the node 1310 is also disposed in the low-voltage domain; that is, the voltage on the node 1310 is at a voltage level that is within the range of the fixed power supply 420. The switch 1108, as described hereinabove, is operable to switch between the voltage on a node 1316 on the output of the fixed power supply 420 to supply power to the amplifier 1302.

In operation, the current Is flows through the resistor Rs 214. Since the voltage on the negative input of the amplifier 1302 is the same as the voltage on the positive input, Vn, the voltage across both resistor 214 and 1306 is the same such that IxRx=IsRs and Ix=(Is)Rs/Rx. The voltage across resistor Ry 1312 is defined as Vout=IxRy, and substituting the relationship for Ix, Vout=(RyIs)Rs/Rx or Vout=αIs, with the proportionality factor α being (Ry)Rs/Rx. Thus, the current Is through the resistor 214 is proportional to the values of the resistors Ry, Rs, and Rx. To process the sensing operation in the high-voltage domain, a translation is performed of the voltage through resistor 214 to a current to drive the resistor 1312 and then convert this current Ix to a voltage proportional to the voltage across resistor 214. The power to the voltage sense circuit in the floating circuit 1106 is provided either from the floating supply 1107 including the Zener diode 610 and capacitor 612, when the voltage on node 216 is above the voltage output of the fixed power supply 420, node 1316, or directly from the output of the fixed power supply 420 when the voltage on node 216 is below the voltage on node 1316.

A differential switched capacitor amplifier is disclosed operating across first and second voltage domains, and includes a fixed power supply operating at a fixed supply level in the first voltage domain. It further includes a floating power supply operating at a floating power supply level referenced from a high voltage greater than the fixed power supply level to a floating ground. A differential amplifier is provided operating in the first voltage domain and includes first and second differential inputs and first and second differential outputs. First and second feedback capacitors are disposed between a respective one of the first and second inputs and a respective one of the first and second outputs. First and second feedback switches are disposed in parallel with an associated one of the first and second feedback capacitors. First and second sampling capacitors are interfaced between a differential voltage in the second voltage domain in the first and second differential inputs of the differential amplifier. First and second sampling switches are provided for sampling in a sampling operation the differential voltage in the second voltage domain onto the first and second sampling capacitors in a sampling operation. An equalizing switch connects the first and second sampling capacitors together in the second voltage domain to equalize a value interfaced with the second voltage domain after sampling. An interface circuit is provided for interfacing the floating power supply to the first and second sampling switches and to the equalizing switch. A controller is operable to control the first and second feedback switches in the first voltage domain and the first and second sampling switches and the equalizing switch in the second voltage domain.

The interface circuit further includes a crossover switch for switching an output of either the floating power supply or an output of the fixed power supply to the second voltage domain and selecting the output of the fixed power supply whenever a voltage level of the floating power supply referenced to the floating ground is equal to or below the supply level in the first voltage domain.

The digital control signals are generated in the first voltage domain to control the first and second feedback switches in the first voltage domain. The digital control signals are generated in the first voltage domain to control the first and second sampling switches and the equalizing switch in the second voltage domain. A level shifter shifts the digital control signals generated in the first voltage domain to digital control signals operating in the second voltage domain between the floating power supply level and the floating ground.

A wireless power transmitter is disclosed having an input power source and includes a variable DC power circuit for outputting a variable DC power level in a first voltage domain. A current sense resistor is disposed in series with an output of the variable DC power circuit. An RF inverter converts the output of the variable DC power circuit to an AC driving signal and a controller is provided for operating in a second and fixed voltage domain. The controller controls the variable DC power circuit and RF inverter, and includes a current sense monitor for sensing a voltage across the current sense resistor in order to control the output of the variable DC power circuit. The current sense monitor includes a plurality of digital switch circuitry operable over a DC digital operating voltage range. A first portion of the plurality of digital switch circuitry operates in the first voltage domain and a second portion of the plurality of digital switch circuitry operates in the second voltage domain. A digital controller generates a plurality of digital control signals in the second voltage domain to control the first and second portions of the plurality of digital switch circuitry in the respective first and second voltage domains. Of the digital control signals operate in the respective voltage domains within the DC digital operating voltage range.

It will be appreciated by those skilled in the art having the benefit of this disclosure that this Current Shunt Monitor provides a high side Current Shunt Monitor that utilizes a floating power supply and a switched capacitor amplifier to sense the voltage level on a sense resistor that operates from a very low voltage to a very high voltage. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A wireless power transmission system, comprising:
 a power transmitting unit including a primary resonator for generating an AC wireless power charging signal;
 wherein the power transmitting unit further comprises a current shunt monitor (CSM) circuit for monitoring a current to the primary resonator, the CSM circuit including an analog circuit with analog circuit components operating on a circuit supply voltage level that is less than a highest rated voltage on a voltage input monitored by the current shunt monitor circuit to the primary resonator, the current shunt monitoring circuit switching power to at least a first portion of the analog circuit from a floating voltage power supply voltage level to a fixed voltage power supply voltage level responsive to detecting that a voltage level on the voltage input to the primary resonator is within a predetermined voltage value of the fixed voltage power supply voltage level;

a power receiving unit including a secondary resonator for generating a resonant wireless interface with the primary resonator for connection to the power transmitting unit, the connection for receiving the AC wireless power charging signal and generating a DC power charging signal responsive thereto; and an interface for applying the DC power charging signal to a device to be charged.

2. The wireless power transmission system of claim 1, wherein the CSM circuit further comprises:

a sense resistor disposed proximate a high side voltage input of the primary resonator and operating across first and second voltage domains;

a power supply, including:
- a fixed voltage power supply operating at a fixed voltage output operating at the fixed voltage power supply voltage level relative to a system ground reference in the first voltage domain;
- a floating power supply operating at the floating voltage power supply voltage level in a second voltage domain and referenced from the voltage level on the voltage input and a floating ground, the floating power supply configured to provide power to at least a first portion of the analog circuit;

a voltage sense circuit having first and second inputs connected across the sense resistor on opposite sides thereof and an output for providing an amplified analog output signal proportional to a voltage across the sense resistor, the voltage sense circuit including the analog circuit with the analog circuit components operating on the circuit supply voltage level that is less than the highest rated voltage on the voltage input; and a crossover circuit configured to switch power to the at least a first portion of the analog circuit from the floating power supply at the floating voltage power supply voltage level to the fixed voltage power supply at the fixed voltage power supply voltage level upon detecting that the voltage level on the voltage input is within the predetermined voltage value of the fixed voltage power supply voltage level.

3. The wireless power transmission system of claim 2, wherein the voltage level on the voltage input is the voltage on a highest voltage side of the sense resistor.

4. The wireless power transmission system of claim 2, wherein the fixed voltage power supply provides power to at least a second portion of the analog circuit for voltage values on a highest voltage side of the sense resistor.

5. The wireless power transmission system of claim 2, wherein the analog circuit includes a differential amplifier having first and second inputs connected to opposite sides of the sense resistor and a differential analog output.

6. The wireless power transmission system of claim 5, wherein the differential amplifier comprises a switched capacitor amplifier controlled by digital switch control signals and wherein at least a first portion of the switched capacitor amplifier is powered by the floating power supply when the voltage level of the voltage input is above the fixed voltage power supply voltage level by the predetermined voltage value.

7. The wireless power transmission system of claim 6, wherein the fixed voltage power supply powers at least a second portion of the switched capacitor amplifier and wherein the digital switch control signals control both the first and second portions of the switched capacitor amplifier.

8. The wireless power transmission system of claim 7, wherein the digital switch control signals are received at voltage levels between system ground reference and the fixed voltage power supply voltage level and wherein the voltage sense circuit includes a voltage translator for translating a first portion of the digital switch control signals controlling the first portion of the switched capacitor amplifier to translated digital control signals to vary in voltage between the voltage level of the voltage input and the floating ground when the voltage level of the voltage input is above the fixed voltage power supply voltage level by the predetermined voltage value.

9. The wireless power transmission system of claim 8, wherein the switched capacitor amplifier includes first and second switching capacitors, each having one plate thereof connectable to a respective side of the sense resistor through a respective switch controlled by at least one of the translated digital control signals and each of the first and second switching capacitors having other plates thereof connected to a respective one of first and second inputs of a differential input analog amplifier powered by the fixed voltage power supply, wherein the second portion of the switched capacitor amplifier includes the differential input analog amplifier.

10. A wireless power transmission system, comprising:

a power transmitting unit including a primary resonator for generating an AC wireless power charging signal;

a current shunt monitor (CSM) circuit within the power transmitting unit, the CSM circuit including an analog circuit with analog circuit components operating on a circuit supply voltage level that is less than a highest rated voltage on a voltage input monitored by the current shunt monitor circuit to the primary resonator wherein the CSM circuit further comprises:

a sense resistor disposed proximate a high side voltage input of the primary resonator and operating across first and second voltage domains;

a fixed voltage power supply operating at a fixed voltage output operating at a fixed voltage power supply voltage level relative to a system ground reference in the first voltage domain;

a floating power supply operating at a floating voltage power supply voltage level in a second voltage domain and referenced from a voltage level on the voltage input and a floating ground, the floating power supply configured to provide power to at least a first portion of the analog circuit;

a voltage sense circuit having first and second inputs connected across the sense resistor on opposite sides thereof and an output for providing an amplified analog output signal proportional to a voltage across the sense resistor, the voltage sense circuit including an analog circuit with analog circuit components operating on the circuit supply voltage level that is less than the highest rated voltage on the voltage input; and a crossover circuit configured to switch power to the at least a first portion of the analog circuit from the floating power supply at the floating voltage power supply voltage level to the fixed voltage power supply at the fixed voltage power supply voltage level upon detecting that the voltage level on the voltage input is within a predetermined voltage value of the fixed voltage power supply voltage level;

a power receiving unit including a secondary resonator for generating a resonant wireless interface with the primary resonator for connection to the power transmitting unit, the connection for receiving the AC wireless power charging signal and generating a DC power charging signal responsive thereto; and an interface for applying the DC power charging signal to a device to be charged.

11. The wireless power transmission system of claim 10, wherein the voltage level on the voltage input is the voltage on a highest voltage side of the sense resistor.

12. The wireless power transmission system of claim 10, wherein the fixed voltage power supply provides power to at least a second portion of the analog circuit for voltage values on a highest voltage side of the sense resistor.

13. The wireless power transmission system of claim 10, wherein the analog circuit includes a differential amplifier having first and second inputs connected to opposite sides of the sense resistor and a differential analog output.

14. The wireless power transmission system of claim 13, wherein the differential amplifier comprises a switched capacitor amplifier controlled by digital switch control signals and wherein at least a first portion of the switched capacitor amplifier is powered by the floating power supply when the voltage level of the voltage input is above the fixed voltage power supply voltage level by the predetermined voltage value.

15. The wireless power transmission system of claim 14, wherein the fixed voltage power supply powers at least a second portion of the switched capacitor amplifier and wherein the digital switch control signals control both the first and second portions of the switched capacitor amplifier.

16. The wireless power transmission system of claim 15, wherein the digital switch control signals are received at voltage levels between system ground reference and the fixed voltage power supply voltage level and wherein the voltage sense circuit includes a voltage translator for translating a first portion of the digital switch control signals controlling the first portion of the switched capacitor amplifier to translated digital control signals to vary in voltage between the voltage level of the voltage input and the floating ground when the voltage level of the voltage input is above the fixed voltage power supply voltage level by the predetermined voltage value.

17. The wireless power transmission system of claim 16, wherein the switched capacitor amplifier includes first and second switching capacitors, each having one plate thereof connectable to a respective side of the sense resistor through a respective switch controlled by at least one of the translated digital control signals and each of the first and second switching capacitors having other plates thereof connected to a respective one of first and second inputs of a differential input analog amplifier powered by the fixed voltage power supply, wherein the second portion of the switched capacitor amplifier includes the differential input analog amplifier.

18. A method for wirelessly charging a device, comprising:
generating, at a power transmitting unit including a primary resonator, an AC wireless power charging signal;
monitoring, at a current shunt monitor (CSM) circuit, a current to the primary resonator of the power transmitting unit, the CSM circuit including an analog circuit with analog circuit components operating on a circuit supply voltage level that is less than a highest rated voltage on a voltage input monitored by the current shunt monitor circuit to the primary resonator;
detecting that a voltage level on the voltage input to the primary resonator is within a predetermined voltage value of a fixed voltage power supply voltage level;
switching, by the current shunt monitoring circuit, power to at least a first portion of the analog circuit from a floating voltage power supply voltage level to the fixed voltage power supply voltage level;
generating, at a power receiving unit including a secondary resonator, a resonant wireless interface with the primary resonator of the power transmitting unit;
receiving the AC wireless power charging signal over the resonant wireless interface;
generating a DC power charging signal responsive to the AC wireless power charging signal; and
applying the DC power charging signal to a device to be charged via an interface.

19. The method of claim 18, wherein the step of detecting further comprises sensing a voltage across a sense resistor on opposite sides thereof with a voltage sense circuit and outputting an amplified analog output signal proportional to the voltage across the sense resistor.

20. The method of claim 19, wherein the step of switching further comprises:
generating a fixed voltage output operating at the fixed voltage power supply voltage level relative to a system ground reference;
generating the floating voltage power supply voltage level referenced from a voltage level on the voltage input and a floating ground, and powering at least a first portion of the voltage sense circuit from the floating voltage power supply voltage level, the floating voltage power supply voltage level configurable to be maintained at the floating voltage power supply voltage level as the voltage input varies from a voltage level above the fixed voltage power supply voltage level to a voltage level within a predetermined voltage value of the fixed voltage power supply voltage level, and the floating voltage power supply voltage level powering the at least a first portion of the voltage sense circuit at least when the voltage level of the voltage input is above the fixed voltage power supply voltage level by the predetermined voltage value, and
switching power to the at least a first portion of the voltage sense circuit from the floating voltage power supply voltage level to the fixed voltage power supply voltage level upon detecting that the voltage level on the voltage input is within the predetermined voltage value of the fixed voltage power supply voltage level.

* * * * *